US010777101B2

(12) United States Patent
Park

(10) Patent No.: US 10,777,101 B2
(45) Date of Patent: Sep. 15, 2020

(54) FOLDABLE DISPLAY DEVICE AND METHOD OF MANUFACTURING FOLDABLE DISPLAY DEVICE

(71) Applicant: Samsung Display Co., Ltd., Yongin-si (KR)

(72) Inventor: Myoung Seo Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/260,113

(22) Filed: Jan. 29, 2019

(65) Prior Publication Data

US 2019/0340959 A1 Nov. 7, 2019

(30) Foreign Application Priority Data

May 4, 2018 (KR) ........................ 10-2018-0051804

(51) Int. Cl.
*G09F 9/30* (2006.01)
*H01L 51/00* (2006.01)
*H01L 51/52* (2006.01)
*H01L 51/56* (2006.01)
*H01L 51/50* (2006.01)
(Continued)

(52) U.S. Cl.
CPC ............ *G09F 9/301* (2013.01); *G06F 1/1652* (2013.01); *G06F 3/0412* (2013.01); *H01L 27/322* (2013.01); *H01L 27/3211* (2013.01); *H01L 27/3246* (2013.01); *H01L 51/0097* (2013.01); *H01L 51/5036* (2013.01); *H01L 51/5246* (2013.01); *H01L 51/5253* (2013.01); *H01L 51/5256* (2013.01); *H01L 51/56* (2013.01); *G02F 1/133305* (2013.01);
(Continued)

(58) Field of Classification Search
CPC ............ H01L 51/5253; H01L 51/0097; H01L 51/5256; H01L 51/5246; H01L 51/56; H01L 51/5036; H01L 27/3246; H01L 27/322; H01L 27/3211; H01L 51/0032; H01L 2251/5338; H01L 2227/323; H01L 27/3218; H01L 27/3216; H01L 51/5237; H01L 51/5281; H01L 2251/558; H01L 27/3225; G06F 1/1652; G06F 3/0412; G09F 9/301; G02F 1/133305
See application file for complete search history.

(56) References Cited

U.S. PATENT DOCUMENTS 9,356,087 B1* 5/2016 Lee ..................... H01L 27/3276
9,748,315 B2 8/2017 Kim
(Continued)

FOREIGN PATENT DOCUMENTS

KR 10-2016-0016267 2/2016
KR 10-2017-0026020 3/2017

*Primary Examiner* — Kevin Quarterman
(74) *Attorney, Agent, or Firm* — H.C. Park & Associates, PLC

(57) ABSTRACT

A foldable display device including a panel pad unit, a first polymer layer disposed on the panel pad unit and including a first repeated subunit organic compound, a rigid layer disposed on the first polymer layer, a second polymer layer disposed on the rigid layer and including a second repeated subunit organic compound, a panel light-emitting unit disposed on the second polymer layer, and a third polymer layer disposed on the panel light-emitting unit and including a third repeated subunit organic compound.

13 Claims, 30 Drawing Sheets

(51) Int. Cl.
*H01L 27/32* (2006.01)
*G06F 1/16* (2006.01)
*G06F 3/041* (2006.01)
*G02F 1/1333* (2006.01)

(52) U.S. Cl.
CPC .... *H01L 51/0032* (2013.01); *H01L 2227/323* (2013.01); *H01L 2251/5338* (2013.01)

(56) References Cited

U.S. PATENT DOCUMENTS

| | | |
|---|---|---|
| 9,753,200 B2 | 9/2017 | Lee et al. |
| 2013/0244079 A1* | 9/2013 | Mandlik ................. H01L 51/56 429/122 |
| 2015/0179717 A1* | 6/2015 | Kawata ............... H01L 29/7869 257/43 |
| 2015/0227172 A1* | 8/2015 | Namkung ............. G06F 1/1652 345/173 |
| 2016/0093685 A1* | 3/2016 | Kwon ................ H01L 51/5237 257/40 |
| 2016/0172427 A1 | 6/2016 | Lee et al. |
| 2016/0190471 A1 | 6/2016 | Inoue et al. |
| 2016/0218305 A1* | 7/2016 | Kim .................. G02F 1/133305 |
| 2016/0226024 A1* | 8/2016 | Park ................... H01L 27/3262 |
| 2017/0075464 A1 | 3/2017 | Ahn |

\* cited by examiner

FOLDABLE DISPLAY DEVICE AND METHOD OF MANUFACTURING FOLDABLE DISPLAY DEVICE

CROSS REFERENCE TO RELATED APPLICATION

This application claims priority from and the benefit of Korean Patent Application No. 10-2018-0051804, filed on May 4, 2018, which is hereby incorporated by reference for all purposes as if fully set forth herein.

BACKGROUND

Field

Exemplary embodiments of the invention relate generally to a display device and, more specifically, to a foldable display device that can switch between a folded state and an unfolded state, and a method of fabricating the same.

Discussion of the Background

Display devices may display images and include a display panel, such as an organic light-emitting display panel or a liquid-crystal display panel.

For example, a mobile electronic device includes a display device for providing an image to a user. More and more mobile electronic devices include a display screen that is relatively larger in size than a conventional display screen while having the same or smaller volume or thickness. Also, a foldable display device or a bendable display device that can be folded and unfolded to provide a larger screen only at the time of the usage is being developed.

The above information disclosed in this Background section is only for understanding of the background of the inventive concepts, and, therefore, it may contain information that does not constitute prior art.

SUMMARY

Devices constructed according to exemplary embodiments of the invention are capable of providing a foldable display device with improved quality and a method of fabricating the same.

Additional features of the inventive concepts will be set forth in the description which follows, and in part will be apparent from the description, or may be learned by practice of the inventive concepts.

A foldable display device according to an exemplary embodiment includes a panel pad unit, a first polymer layer disposed on the panel pad unit and including a first repeated subunit organic compound, a rigid layer disposed on the first polymer layer, a second polymer layer disposed on the rigid layer and including a second repeated subunit organic compound, a panel light-emitting unit disposed on the second polymer layer, and a third polymer layer is disposed on the panel light-emitting unit and including a third repeated subunit organic compound.

The rigid layer may include metal.

The rigid layer may include a first portion and a second portion spaced apart from each other.

A neutral plane may be formed in the panel light-emitting unit between the first portion and the second portion.

The rigid layer may include a plurality of protrusions on a lower surface thereof, the protrusions not overlapping with the first polymer layer.

The panel pad unit may be connected to the panel light-emitting unit as a single piece.

The foldable display device may further include a spacer layer disposed between the first polymer layer and the rigid layer.

The second polymer layer may have a visible light transmittance relatively less than that of the third polymer layer.

The second polymer layer may have a visible light transmittance relatively less than that of the first polymer layer.

The second polymer layer may have thermo-mechanical properties relatively greater than that of the third polymer layer, and the thermo-mechanical properties may include at least one of ultimate tensile strength, initial tensile modulus, elongation at break, and glass transition temperature.

The first repeated subunit organic compound may be included in a first series, and the second repeated subunit organic compound and the third repeated subunit organic compound may be included in a second series substantially different from the first series.

The second series may be an aromatic series, and the second repeated subunit organic compound may have an aromatic ring density relatively greater than that of the third repeated subunit organic compound.

The first series may be a non-aromatic series, and the second series may be an aromatic series.

A method of manufacturing a foldable display device according to an exemplary embodiment includes the steps of: preparing a first structure including a first flexible member having a first height, a first upper release film attached to an upper surface of the first flexible member with a first release force, and a lower release film attached to a lower surface of the first flexible member with a second release force relatively greater than the first release force; detaching the first upper release film from the upper surface of the first flexible member without detaching the lower release film from the lower surface of the first flexible member; forming a second structure on the upper surface of the first flexible member, the second structure including a second flexible member having a second height, a second upper release film attached to an upper surface of the second flexible member with a third release force, and a double-sided adhesive layer attached to a lower surface of the second flexible member; and detaching the lower release film from the lower surface of the first flexible member without detaching the second upper release film from the upper surface of the first flexible member, after forming the second structure on the upper surface of the first flexible member, in which an adhesive force of the double-sided adhesive layer to the upper surface of the first flexible member and an adhesive force of the double-sided adhesive layer to the lower surface of the second flexible member are relatively greater than the second release force and the third release force, the second release is force is relatively larger than the first release force such that the second release force is about "n" times the first release force, in which "n" is a real number relatively larger than about one, and the second release force is relatively larger than the third release force such that the second release force is "m" times the third release force, in which "m" is a real number relatively larger than about one.

The second flexible member may include a panel layer having an electroluminescent unit.

The upper surface of the second flexible member may be subjected to an anti-fingerprint process.

The "n" may be relatively greater than "m".

A display device according to another exemplary embodiment includes a lower electrode layer, a pixel defining layer, a first electroluminescent layer, a second electroluminescent layer, an upper electrode, and a color filter layer. The lower electrode layer includes a first lower electrode having first and second areas, and a second lower electrode has third and fourth areas. The pixel defining layer is disposed on the lower electrode layer and does not cover the first and third areas while covering the second and fourth areas. The first electroluminescent layer is disposed on the pixel defining layer and the first area, has an outline substantially surrounding an outline of the first area when viewed from the top, and has an area relatively greater than the first area. The second electroluminescent layer is disposed on the pixel defining layer and the third area, has an outline substantially surrounding an outline of the third area when viewed from the top, and has an area relatively greater than the third area. The upper electrode is disposed on the first and second electroluminescent layers, has an outline substantially surrounding the outlines of the first and second electroluminescent layers when is viewed from the top, and has an area relatively greater than the first and second electroluminescent layers. The color filter layer has a first color filter disposed on the upper electrode and has a first color filtering area of which an outline thereof is disposed between the outline of the first area and the outline of the first electroluminescent layer when viewed from the top, and a second color filter disposed on the upper electrode and having a second color filtering area of which an outline thereof is disposed between the outline of the third area and the outline of the second electroluminescent layer when viewed from the top.

The first electroluminescent layer may not be a common layer but an individual layer, the second electroluminescent layer may not be a common layer but an individual layer, and the first and second electroluminescent layers may overlap with each other.

The first electroluminescent layer may be configured to emit light of a first wavelength, the second electroluminescent layer may be configured to emit light of a second wavelength relatively shorter than the first wavelength, and the first electroluminescent layer may be disposed on the second electroluminescent layer.

The first electroluminescent layer may overlap with the second color filtering area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, is illustrate exemplary embodiments of the invention, and together with the description serve to explain the inventive concepts.

DETAILED DESCRIPTION

Figure 1:
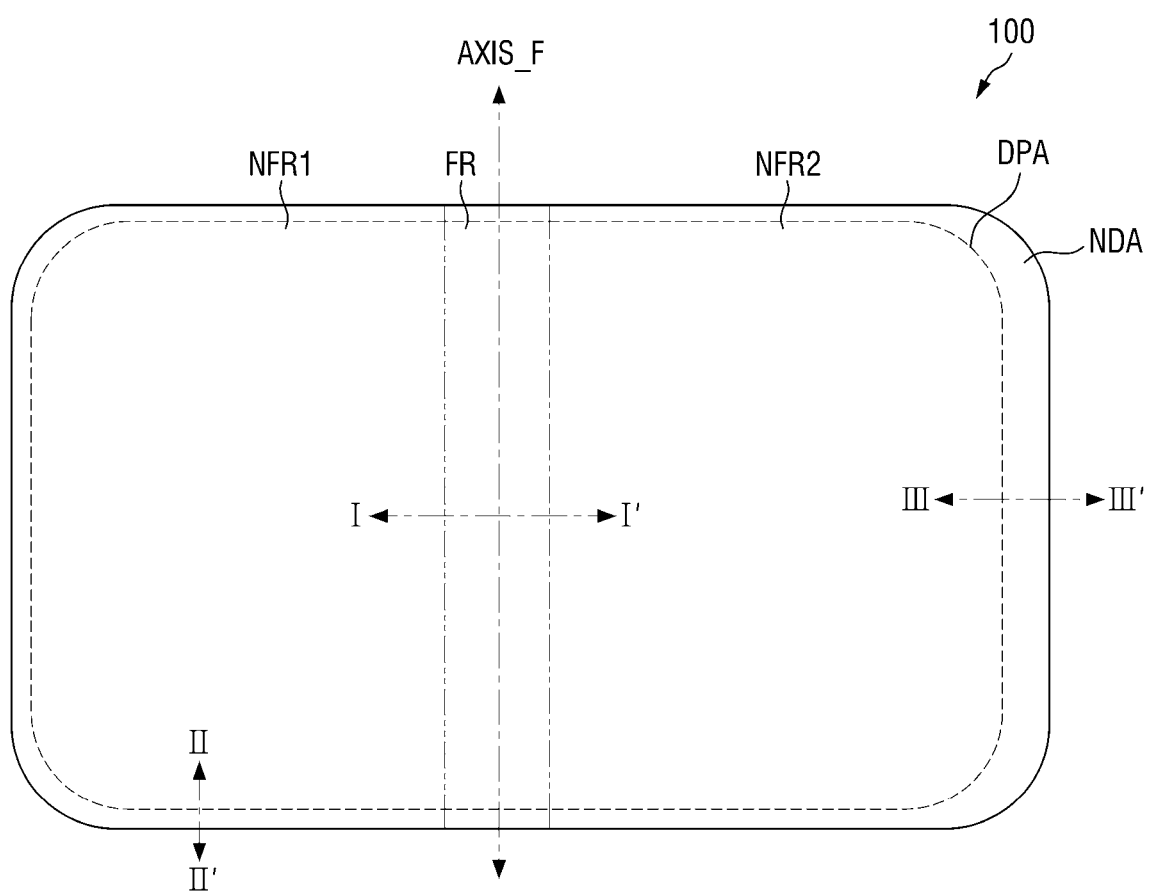
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the is inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the is group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented is by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
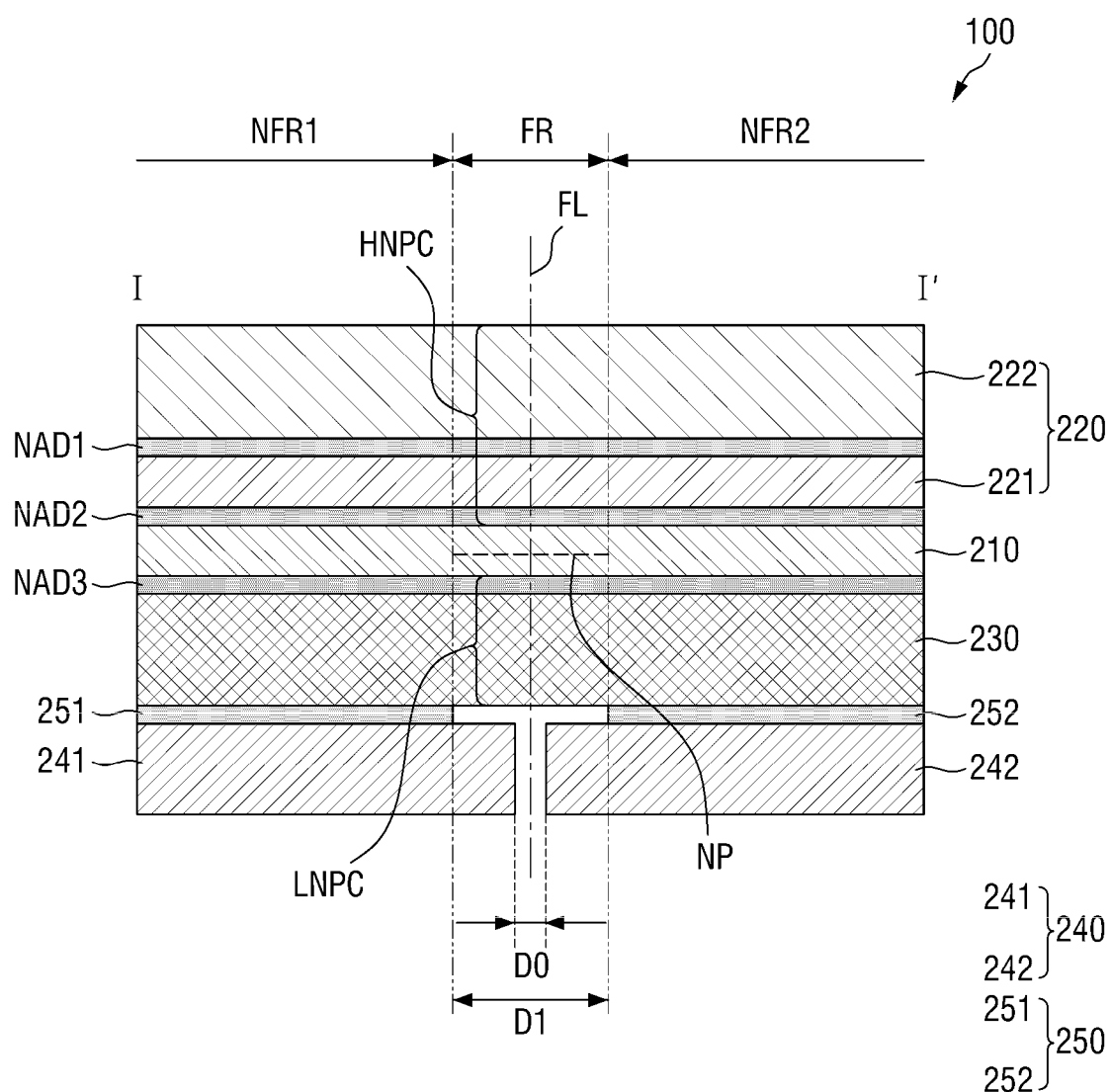
FIG. 2 is a cross-sectional view taken along line I-I' of FIG. 1.

FIG. 1 is a plan view of a display device according to an exemplary embodiment. FIG. 2 is a cross-sectional view taken along line I-I' of FIG. 1.

Referring to FIGS. 1 and 2, a display device 100 may have a substantially rectangular shape when viewed from the top. More particular, the display device 100 may have a rectangular shape having rounded corners when viewed from the top, but the inventive concepts are not limited thereto. For example, the display device 100 may have a rectangular is shape having corners at the right angle.

As used herein, "top" and "upper surface" in the thickness direction refer to the side of the display panel in which images are displayed in the unfolded state, whereas "bottom" and "lower surface" refer to the opposite side of the display panel in the unfolded state, unless stated otherwise. In addition, "upper side," "lower side," "left side," and "right side" in the plane are defined when the display surface is viewed from the top.

The display device 100 may be bent with respect to a folding axis AXIS_F extended in the vertical direction. More particularly, the display device 100 may be switchable between the folded state (e.g., folded with respect to the folding axis AXIS_F) and the unfolded state. The switching between the folded state and the unfolded state of the display device 100 will be described in more detail below.

As used herein, the term "foldable" may refer to partial folding, entire folding, rollable, in-folding, out-folding, and flexible. In addition, the term "display device" may refer to an information display device, such as a television and a terminal device, as well as an optical device such as a luminaire.

The display device 100 may include a display module 210 (or a flexible display module, a display panel, a flexible display panel), an upper flexible module 220 (or a flexible upper module), a lower flexible module 230 (or a flexible lower module), and a rigid layer 240 (or a rigid layer). The display device 100 may further include double-sided adhesive layers NAD1, NAD2, NAD3, and 250 each disposed (or interposed) between two of the display module 210, the upper flexible module 220, the lower flexible module 230, and the rigid layer 240.

The display module 210 may display an image by receiving data signals. As the display module 210, one of an organic light-emitting display module, a liquid-crystal display is module, a plasma display module, an electrophoretic display module, an electro-wetting display module, a quantum-dot emission display module, a micro LED display module, etc. may be employed. FIG. 2 shows an organic light-emitting display module as the display module 210.

The display module 210 may include a flexible substrate including a flexible polymer material, such as polyimide. Accordingly, the display module 210 may be curved, bent, folded, or rolled.

The display module 210 may have a shape substantially similar to that of the display device 100 when viewed from the top. However, the inventive concepts are not limited to the particular shape of the display module 210. For example, at least one side (e.g., the left side) of the display module 210 may be curved or bent at the right angle. A circuit board 422 (see FIG. 4) including wires for transmitting signals to drive the display module 210 may be connected through at least one side of the module panel 210. The circuit board 422 may be disposed to overlap the display module 210 in the thickness direction thereof. The circuit board 422 will be described in more detail below with reference to FIG. 4.

The display module 210 may include a display area DPA (or an emission area) where images are displayed, and a non-display area NDA (or a non-emission area) where no image is displayed.

The display area DPA may be disposed at the center of the display module 210. The display area DPA may include pixels (or electroluminescent units). The pixels will be described later in more detail with reference to FIG. 3.

The display area DPA may have a rectangular shape with rounded corners. However, the inventive concepts are not limited to the shapes of the display area. For example, the display area DPA may have various shapes, such as a square, a rectangle, or other polygonal or circular shape, elliptical shape, etc.

The non-display area NDA may be located around the display area DPA. A portion of the display module 210 other than the display area DPA may be the non-display area NDA. The non-display area NDA may refer to the area from the outer boundary of the display area DPA to the edge of the display module 210. In the non-display area NDA, signal wiring for applying a signal to the display area DPA or drive circuits may be disposed. In addition, the outermost part of a black matrix may be disposed in the non-display area NDA.

In addition, the display module 210 may include a foldable region FR (or a bendable region). The foldable region FR will be described in detail later together with the rigid layer 240.

The upper flexible module 220 may overlap with the display module 210 in the thickness direction and may be disposed on the display module 210. The upper flexible module 220 may be used to adjust the location of a neutral plane NP of the display device 100 together with the lower flexible module 230. When the display device 100 is bent or folded, a tensile stress occurs on one side of the display device with respect to the neutral plane NP, while a compressive stress occurs on the other side of the display device 100 with respect to the neutral plane BP. Between the opposing sides, there is a plane that is neither expanded nor contracted, which is defined as the neutral plane NP. There is no bending stress on the neutral plane NP. For example, the upper flexible module 220 (or a high neutral plane control portion (HNPC) including the upper flexible module 220) and the lower flexible module 230 (or a low neutral plane control portion (LNPC) including the lower flexible module 230) may be used to place the neutral plane NP of the display device 100 in the display module 210 (e.g., in the layer on which the driving transistors of the display module 210 are formed).

The upper flexible module 220 may include a flexible function module 221 and a flexible window module 222.

The flexible function module 221 may include at least one functional layer. The functional layer may perform a touch sensing feature, a color filtering feature, a color conversion feature, a polarization feature, a biometric information recognition feature (for example, a fingerprint recognition feature), etc. The functional layer may be a sheet layer made of a sheet, a film layer made of a film, a thin film layer, a coating layer, a panel, a plate or the like. A single functional layer may be made up of a single layer or a plurality of thin films or coating layers stacked on one another. For example, the functional layer may be a touch sensing panel, a color filter, an optical film, a fingerprint sensing panel, or the like.

The flexible function module 221 may include an optical film, such as a micro-lens and a prism film. The optical film may be omitted.

The flexible window module 222 (or window) may be disposed on the flexible function module 221. The first upper double-sided adhesive layer NAD1 may be disposed (or interposed) between the flexible window module 222 and the flexible function module 221. As used herein, the first upper double-sided adhesive layer NAD1 has upper and lower surfaces that are adhesive. For example, the first upper double-sided adhesive layer NAD1 may be an optical clear adhesive (OCA).

The flexible window module 222 covers and protects the display module 210. The flexible window module 222 may be made of a transparent material. The flexible window module 222 may include plastic. The flexible window module 222 may have flexibility.

Examples of plastics applicable to the flexible window module 222 may include, but are not limited to, polyimide, polyacrylate, polymethylmethacrylate (PMMA), polycarbonate is (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, tri-acetyl cellulose (TAC), cellulose acetate propionate (CAP), and the like. The flexible window module 222 may include one or more of the plastic materials listed above.

The second upper double-sided adhesive layer NAD2 may be disposed between the upper flexible module 220 (or the flexible function module 221) and the display module 210, and the upper flexible module 220 may be attached on (or coupled with) the display module 210 by the second upper double-sided adhesive layer NAD2. The second upper double-sided adhesive layer NAD2 may have substantially the same thickness as the first upper double-sided adhesive layer NAD1. However, the inventive concepts are not limited to a particular thickness of the adhesive layers, and, for example, the second upper double-sided adhesive layer NAD2 may have a thickness substantially different from that of the first upper double-sided adhesive layer NAD1.

The lower flexible module 230 may overlap with the display module 210 in the thickness direction and may be disposed below the display module 210.

The lower flexible module 230 may include at least one functional layer. The functional layer may perform a heat dissipation function, an electromagnetic wave shielding function, a grounding function, a buffering function, a strength enhancing function, a supporting function, a bonding function, a pressure sensing function, and a digitizing function. The functional layer may be, for example, a supporting substrate, a heat-radiating layer, an electromagnetic wave shielding layer, an impact absorbing layer, a bonding layer, a pressure sensor, a digitizer, etc.

The lower flexible module 230 may have a light transmittance relatively less than that of the upper flexible module 220. More particularly, the upper flexible module 220 may have a relatively high light transmittance and may transmit light (or an image) emitted from the display area DPA of the display module 210 toward the top. The lower flexible module 230 may have a relatively low light transmittance and may block light that is downwardly emitted from the display area DPA of the display module 210 and reflected.

The lower double-sided adhesive layer NAD3 may be disposed between the lower flexible module 230 and the display module 210. The lower flexible module 230 may be attached to the lower surface of the display module 210 by the lower double-sided adhesive layer NAD3. Similarly to the first and second upper double-sided adhesive layers NAD1 and NAD2, the lower double-sided adhesive layer NAD3 has upper and lower surfaces that are adhesive. For example, the lower double-sided adhesive layer NAD3 may be a press sensitive adhesive (PSA).

The lower flexible module 230 may include an impact absorbing layer. The impact absorbing layer may be used to block the impact applied from the outside (for example, from the bottom) from being transmitted to the display module 210. For example, the impact absorbing layer may be made of a material including polyurethane (PU), thermoplastic polyurethane (TPU), silicon (Si), polydimethylacrylamide (PDMA), etc.

The rigid layer 240 may overlap with the lower flexible module 230 in the thickness direction and may be disposed below the lower flexible module 230.

The rigid layer 240 may be made of a material including metal, such as stainless steel (SUS) and aluminum, or a polymer material, such as polymethyl methacrylate (PMMA), polycarbonate (PC), polyvinyl alcohol (PVA), acrylonitrile-butadiene-styrene (ABS) and is polyethylene terephthalate (PET). The rigid layer 240 may prevent the display module 210 from being bent by an external force or may mitigate (or reduce) the degree of bending (e.g., bending angle, bending radius of curvature) of the display module 210. More particularly, the rigid layer 240 can maintain the display module 210 in a relatively flat state even if an external force is applied. The rigid layer 240 may be rigid or semi-rigid. For example, the rigid layer 240 may be a stainless steel film having a thickness of 150 μm to 200 μm. As another example, the rigid layer 240 may be an aluminum film having a thickness of 150 μm to 200 μm.

The double-sided adhesive layer 250 may be disposed between the rigid layer 240 and the lower flexible module 230, and the rigid layer 240 may be attached to the lower flexible module 230 by the double-sided adhesive layer 250.

A protrusion or a groove or hole may be formed in the lower surface of the rigid layer 240 so that a housing may be coupled with the rigid layer 240 (or the display device 100) by the protrusion or groove.

The rigid layer 240 may include a first plate 241 (or a first part) and a second plate 242 (or a second part) that are separated from each other in the left-and-right direction (or in the horizontal direction). The first plate 241 and the second plate 242 may be disposed on the same plane and spaced apart from each other by a reference distance DO in the horizontal direction. For example, the reference distance DO may be 0.1 mm or less. The first and second plates 241 and 242 are, but not limited to, mutually symmetric with respect to a folding line FL (e.g., the line meeting the folding axis AXIS_F in the thickness direction). For example, the first and second plates 241 and 242 may be mutually asymmetric with respect to the folding line FL.

Although the first plate 241 and the second plate 242 are depicted as being spaced apart from each other in FIG. 2, this is merely illustrative to emphasize that the first plate 241 is and the second plate 242 are separated from each other (or mutually non-contiguous). For example, the inner side surface of the first plate 241 may come in contact with at least a portion of the inner side surface of the second plate 242.

According to an exemplary embodiment, the first plate 241 and the second plate 242 may have a shape whose thickness decreases toward the folding line FL. For example, the thickness of the first plate 241 and the second plate 242 may be reduced stepwise. As another example, the thickness of the first plate 241 and the second plate 242 may be continuously reduced. When the thickness of the first plate 241 and the second plate 242 decreases toward the folding line FL, the flexibility of the first plate 241 and the second plate 242 may be greater near the folding line FL than at the other portions.

The double-sided adhesive layer 250 may be disposed between the first and second plates 241 and 242 (or the rigid layer 240) and the lower flexible module 230, so that the first and second plates 241 and 242 may be coupled to the lower portion of the lower flexible module 230 by the double-sided adhesive layer 250.

The double-sided adhesive layer 250 may include a first double-sided adhesive layer 251 (or a third part) and a second double-sided adhesive layer 252 (or a fourth part) that are separated from each other.

The first double-sided adhesive layer 251 overlaps with the display module 210 (or the lower flexible module 230) in the thickness direction in a first non-foldable region NFR1, and may be disposed between the lower flexible module 230 and the first plate 241. Then, the first plate 241 may be coupled to the lower flexible module 230 by the first double-sided adhesive layer 251. Similarly, the second double-sided adhesive layer 252 overlaps with the display module 210 (or the lower flexible module 230) in the thickness direction in a second is non-foldable region NFR2, and may be disposed between the lower flexible module 230 and the second plate 242. Then, the second plate 242 may be coupled to the lower flexible module 230 by the second double-sided adhesive layer 252.

The first double-sided adhesive layer 251 and the second double-sided adhesive layer 252 may be located on the same plane and may be spaced apart from each other by a first distance D1 in the horizontal direction. The first distance D1 may be relatively greater than the reference distance D0. For example, the first distance D1 may be 10 mm or less. The first double-sided adhesive layer 251 and the second double-sided adhesive layer 252 may be symmetrical with respect to the folding axis AXIS_F (or the folding plane in which the folding axis is extended in the thickness direction or the folding line).

The inner side surface of the first plate 241 may be relatively closer to the folding axis AXIS_F than the inner side surface of the first double-sided adhesive layer 251, and the inner side surface of the second plate 242 may be relatively closer to the folding line FL than the inner side surface of the second double-sided adhesive layer 252.

The foldable region FR and the first and second non-foldable regions NFR1 and NFR2 of the display module 210 (or the display device 100) may be set or defined by the first double-sided adhesive layer 251 and the second double-sided adhesive layer 252. The first and second non-foldable regions NFR1 and NFR2 refer to the areas where the first and second plates 241 and 242 are coupled with the lower flexible module 230 by the first and second double-sided adhesive layers 251 and 252, respectively. The first and second non-foldable regions NFR1 and NFR2 may have a small degree of bending by an external force, and may have a generally flat state. More particularly, the first and second non-foldable regions NFR1 and NFR2 may be defined as areas where the rigid layer 240 (or the first and second plates 241 and 242), the is double-sided adhesive layer 250 (or the first and second double-sided adhesive layers 251 and 252), and the display module 210 are all overlapped with one another in the thickness direction and coupled (or attached) with one another. The foldable region FR refers to an area which is not directly coupled with (or supported by) the first plate 241 and the second plate 242, and may have a large degree of bending from an external force. For example, given the same external force, the degree of deformation (for example, the degree of bending) of the foldable region FR may be about three times or more than the degree of deformation of the first and second non-foldable regions NFR1 and NFR2. The foldable region FR may be switched from the folded state to the expanded state by an external force, or vice versa.

As shown in FIG. 1, the foldable region FR has a rectangular shape and has a predetermined width W1 in the horizontal direction with respect to the folding axis AXIS_F extending in the up-and-down direction (or vertical direction), and may extend in the vertical direction from the upper side surface to the lower side surface. The width of the foldable region FR may be substantially equal to or substantially similar to the first distance D1 between the first and second double-sided adhesive layers 251 and 252.

The first non-foldable region NFR1 may be connected to one side of the foldable region FR (e.g., the left side of the folding axis AXIS_F). The second non-foldable region NFR2 may be connected to the other side of the foldable region FR (e.g., the right side of the folding axis AXIS_F). The width of the first non-foldable region NFR1 may be substantially equal to or substantially different from the width of the second non-foldable region NFR2.

As described above, the foldable region FR of the display device 100 may be defined by the first and second double-sided adhesive layers 251 and 252, and the neutral plane NP may be aligned with the display module 210 by the high neutral plane control portion HNPC is and the low neutral plane control portion LNPC.

Figure 3:
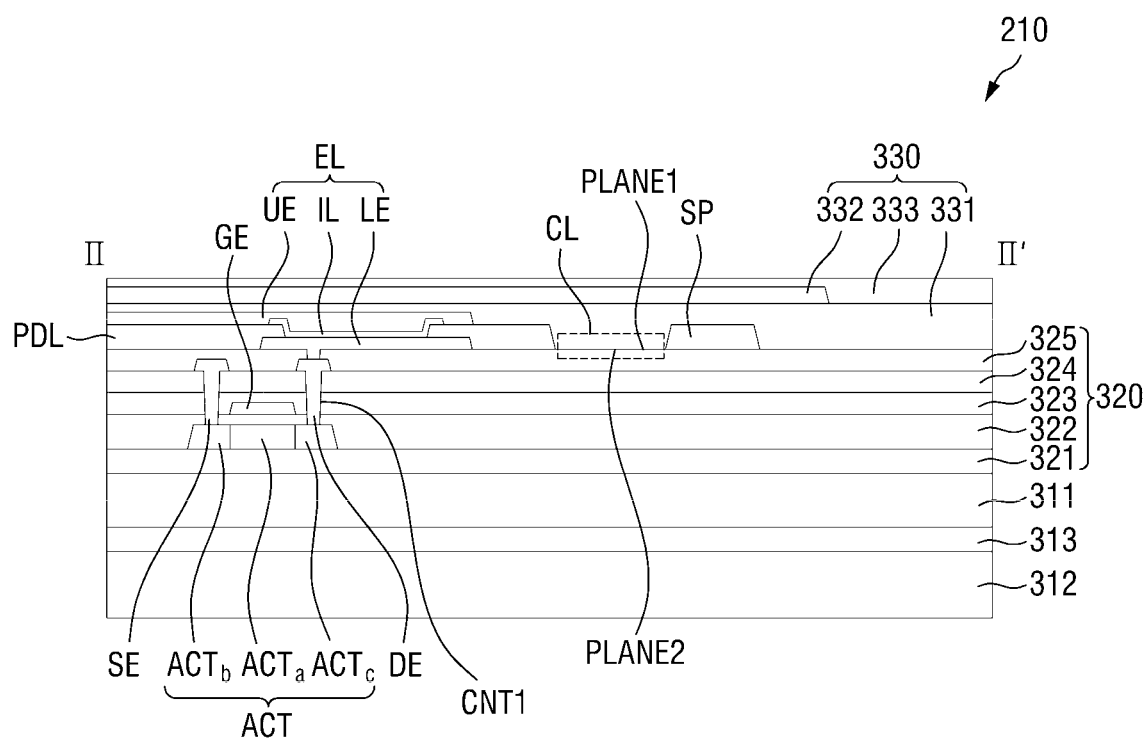
FIG. 3 is a cross-sectional view taken along line II-II' of a flexible display module included in a display device of FIG. 1 according to an exemplary embodiment.

FIG. 3 is a cross-sectional view taken along line II-II' of a flexible display module included in a display device of FIG. 1 according to an exemplary embodiment.

A first organic flexible layer 311 (or a first substrate) may be an insulating substrate. In an exemplary embodiment, the first organic flexible layer 311 may include a material such as a polymer resin. The polymer material may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

A first inorganic layer 321 (or a buffer layer) may be disposed on the first organic flexible layer 311. In an exemplary embodiment, the first inorganic layer 321 may include one of a silicon nitride ($SiN_x$) layer, a silicon oxide ($SiO_2$) layer, and an oxynitride ($SiO_xN_y$) layer.

A semiconductor layer including a semiconductor pattern ACT may be disposed on the first inorganic layer 321. The first inorganic layer 321 is disposed between the semiconductor pattern and the first organic flexible layer 311 to increase the adhesion and also blocks moisture and oxygen which may be transferred from the first organic flexible layer 311 to the semiconductor pattern ACT, and so on. It is to be noted that the first inorganic layer 321 may be eliminated depending on the kind of the first organic flexible layer 311, process conditions, etc. The semiconductor pattern ACT will be described as an example of the semiconductor layer. In an exemplary embodiment, the semiconductor pattern ACT may be made of one selected from polycrystalline silicon, single crystal silicon, low-temperature polycrystalline silicon, amorphous silicon and oxide semiconductor or a mixture thereof. In an is exemplary embodiment, the semiconductor pattern ACT may include a channel region ACTa doped with no impurity, and a source region ACTb and a drain region ACTc doped with impurities. The source region ACTb is located on one side of the channel region ACTa and is electrically connected to a source electrode SE described later. The drain region ACTc is located on the other side of the channel region ACTa and is electrically connected to a drain electrode DE described later.

A second inorganic layer 322 (or a first insulating layer) may be disposed on the semiconductor layer including the semiconductor pattern ACT. In an exemplary embodiment, the second inorganic layer 322 may be a gate insulating layer. In an exemplary embodiment, the second inorganic layer 322 may be made of an inorganic insulating material such as silicon oxide ($SiO_x$) and silicon nitride ($SiN_x$).

A gate conductor including the gate electrode GE may be disposed on the second insulating layer 322. The gate electrode GE may overlap with the semiconductor pattern ACT. For example, the gate conductor may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

A third inorganic layer 323 (or a second insulating layer) may be disposed on the gate conductor including the gate electrode GE. The third inorganic layer 323 may be made of an inorganic insulating material, such as silicon oxide ($SiO_x$) and silicon nitride ($SiN_x$).

A data conductor including the source electrode SE and the drain electrode DE may be disposed on the third inorganic layer 323. The source electrode SE and the drain electrode DE are disposed on the third inorganic layer 323 such that they are spaced apart from is each other. The data conductor may include at least one of metal, an alloy thereof, a metal nitride, a conductive metal oxide, and a transparent conductive material. In an exemplary embodiment, the data conductor may have a single-layer structure or a multi-layers structure including nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se), tantalum (Ta), etc. In addition, an alloy formed by adding at least one of titanium (Ti), zirconium (Zr), tungsten (W), tantalum (Ta), niobium (Nb), platinum (Pt), hafnium (Hf), oxygen (O), and nitrogen (N) to the above-listed metal may be used as the materials of the source electrode SE and the drain electrode DE.

The semiconductor pattern ACT, the gate electrode GE, the source electrode SE, and the drain electrode DE described above form a switching element. Although the switching element is depicted as a top-gate transistor in FIG. 3, the type of the switching element is not limited thereto. For example, the switching element may be a bottom-gate transistor.

A fourth inorganic layer 324 is disposed on the third inorganic layer 323. The fourth inorganic layer 324 may include an inorganic material, such as silicon oxide, silicon nitride and silicon oxynitride.

A fifth inorganic layer 325 may be disposed on the fourth inorganic layer 324 so as to cover the data conductor. A first contact hole CNT1 may be formed in the second inorganic layer 322, the third inorganic layer 323, and the fourth inorganic layer 324 by which at least a part of the drain electrode DE is exposed.

The first to fifth inorganic layers 321 to 325 may form a lower encapsulation structure 320.

A lower electrode LE (or a pixel electrode) may be disposed on the fifth inorganic is layer 325. The lower electrode LE may be electrically connected to the drain electrode DE exposed via the first contact hole CNT1. More particularly, the lower electrode LE may be an anode, which may be a hole injection electrode. When the lower electrode LE is an anode electrode, the lower electrode LE may include a material having a high work function to facilitate hole injection. In addition, the lower electrode LE may be a reflective electrode, a semi-transparent electrode, or a transparent electrode. In an exemplary embodiment, the lower electrode LE may include a reflective material. The reflective material may include, for example, at least one of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

In an exemplary embodiment, the lower electrode LE may have a single layer structure of a multiple layers structure in which two or more materials are stacked on one another.

When the lower electrode LE is made up of multiple layers, the lower electrode LE may include, for example, a reflective layer and a transparent or translucent electrode disposed on the reflective layer. As another example, the lower electrode LE may include a reflective layer and a transparent or translucent electrode disposed under the reflective layer. For example, the lower electrode LE may have, but is not limited to, a three-layer structure of ITO/Ag/ITO.

The transparent or semi-transparent electrode may be made of at least one indium tin oxide (ITO), indium zinc oxide (IZO), zinc oxide (ZnO), Indium Oxide ($In_2O_3$), indium gallium oxide (IGO), and aluminum zinc oxide (AZO).

A pixel defining layer PDL may be disposed over the lower electrode LE. The is pixel defining layer PDL includes an opening exposing at least a part of the lower electrode LE. The pixel defining layer PDL may include an organic material or an inorganic material. In an exemplary embodiment, the pixel defining layer PDL may include a material such as a photoresist, a polyimide resin, an acrylic resin, a silicon compound, and a polyacrylic resin.

An intermediate layer IL (or an organic emissive layer) may be disposed over the lower electrode LE and the pixel defining layer PDL. More specifically, the intermediate layer IL may be disposed on the portion of the lower electrode LE that is exposed via the opening of the pixel defining layer PDL. In an exemplary embodiment, the intermediate layer IL may cover at least a part of the sidewall of the pixel defining layer PDL.

In an exemplary embodiment, the intermediate layer IL may emit one of red, blue, and green colors. In another exemplary embodiment, the intermediate layer IL may emit white light or emit light of one of cyan, magenta and yellow. When the intermediate layer IL emits white light, it may include a white light-emitting material or may have a stack structure of a red light-emitting layer, a green light-emitting layer, and a blue light-emitting layer to emit white light.

An upper electrode UE (or a common electrode) may be disposed over the intermediate layer IL and the pixel defining layer PDL. The upper electrode UE may be formed throughout the entire surface of the intermediate layer IL and the pixel defining layer PDL, for example. In an exemplary embodiment, the upper electrode UE may be a cathode electrode. In an exemplary embodiment, the upper electrode UE may include at least one of Al, Ag, and Mg. In addition, the upper electrode UE may be made of a material having a low work function. In an exemplary embodiment, the upper electrode UE may be made of at least one of indium tin oxide (ITO), indium zinc oxide (IZO), zinc oxide (ZnO), indium oxide ($In_2O_3$), indium gallium oxide (IGO), and aluminum zinc oxide (AZO).

The above-described lower electrode LE, the intermediate layer IL, and the upper electrode UE may form an organic light-emitting diode OLED. However, the inventive concepts are not limited thereto, and the organic light-emitting diode OLED may be a multiple layer structure further including a hole injection layer (HIL), a hole transport layer (HTL), an electron transport layer (ETL), and an electron injection layer (EIL).

An encapsulation layer 330 (or an upper encapsulation multilayer) may be disposed over the upper electrode UE. The encapsulation layer 330 may be used to prevent moisture, air, etc., which may be introduced from the outside, from permeating into the organic light-emitting diode OLED. In an exemplary embodiment, the encapsulation layer 330 may include a sixth inorganic layer 331, an organic layer 332, and a seventh inorganic layer 333.

The sixth inorganic layer 331 may be disposed on the upper electrode UE. The sixth inorganic layer 331 may include at least one selected from the group consisting of silicon oxide ($SiO_x$), silicon nitride ($SiN_x$) and silicon oxynitride ($SiON_x$).

The organic layer 332 may be disposed on the sixth inorganic layer 331. The organic layer 332 may include one of epoxy, acrylate, and urethane acrylate. The organic layer 332 may be used to provide a flat surface over the level difference created by the pixel defining layer PDL.

The seventh inorganic layer 333 may be disposed on the organic layer 332. The seventh inorganic layer 333 may include at least one of silicon oxide ($SiO_x$), silicon nitride ($SiN_x$), and silicon oxynitride ($SiON_x$).

Although each of the sixth inorganic layer 331, the organic layer 332, and the seventh inorganic layer 333 shown in FIG. 3 is made up of a single layer, the inventive concepts is are not limited thereto, and at least one of the sixth inorganic layer 331, the organic layer 332 and the seventh inorganic layer 333 may be made up of multiple layers.

In another exemplary embodiment, the encapsulation layer 330 may include a hexamethyldisiloxane (HMDSO) layer. More specifically, the encapsulation layer 330 may include the sixth inorganic layer 331, the seventh inorganic layer 333 and a HMDSO layer disposed between the sixth inorganic layer 331 and the seventh inorganic layer 333. In particular, the above-described organic layer 332 may be replaced with the HMDSO layer.

In an exemplary embodiment, the HMDSO layer may be formed in the same chamber as the sixth inorganic layer 331 after it is formed, which may simplify the process of forming the encapsulation layer 330. In addition, as the encapsulation layer 330 includes the HMDSO layer that is capable of absorbing stress, the encapsulation layer 300 can have sufficient flexibility.

An inorganic-inorganic closed loop CL may be formed along the outer periphery of the display module 210 on the upper surface of the fifth inorganic layer 325. The inorganic-inorganic closed loop CL may refer to a portion in which an inorganic upper surface PLANE1 of the lower encapsulation structure 320 and an inorganic lower surface PLANE2 of the upper encapsulation multilayer 330 are in direct contact with each other. In this manner, moisture or the like permeating into the space between the fifth inorganic layer 325 and the sixth inorganic layer 331 may be prevented by the inorganic-inorganic closed loop CL.

Figure 4:
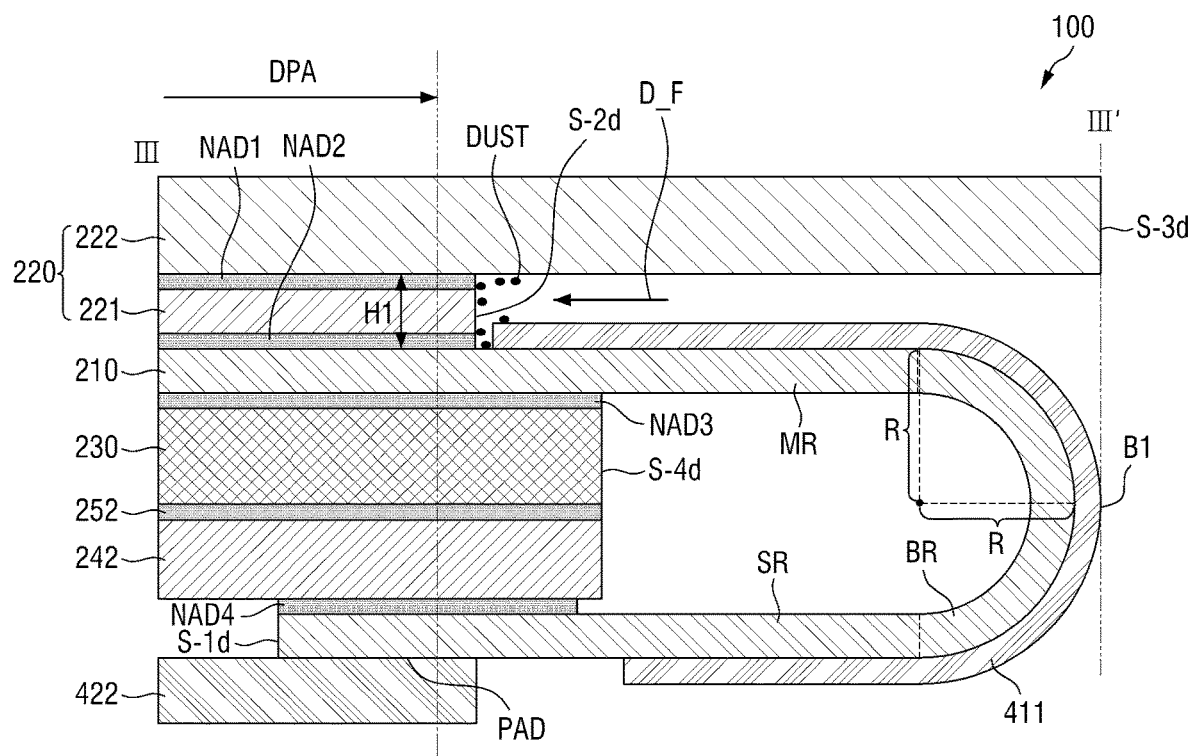
FIG. 4 is a cross-sectional view taken along line III-III' of FIG. 1.

FIG. 4 is a cross-sectional view taken along line III-III' of FIG. 1.

Referring to FIG. 4, the display module 210 may include a main region MR and a bent region BR (or a bending region) connected to one side of the main region MR. The display module 210 may further include a sub region SR connected to the bent region BR and is overlapped with the main region MR in the thickness direction.

The main region MR is a planar area located in one plane, and may include the display area DPA.

The bent region BR is connected to one side of the main region MR. For example, the bent region BR may be connected to the right side of the main region MR. The width of the bent region BR may be, but is not limited to, relatively smaller than the width (e.g., the width of the right side) of the main region MR.

In the bent region BR, the display module 210 may be bent downward (i.e., in the direction away from the display surface) with a curvature R. Although the bent region BR may have a constant radius of curvature, the inventive concepts are not limited thereto. For example, the bent region BR may have a substantially different radius of curvature for each section. As the display module 210 is bent in the bent region BR, the surface of the display module 210 is reversed. More specifically, the surface of the display module 210 facing upward may be changed to face outward in the bent region BR, and then may be changed to face downward.

The sub region SR is extended from the bent region BR. The sub region SR may be extended in a direction parallel to the main region MR after the display device has been bent. The sub region SR may overlap with the main region MR in the thickness direction of the display module 210. The sub region SR may overlap with the non-display area NDA at the edge of the main region MR and may also overlap with the display area DPA of the main region MR.

A fourth double-sided adhesive layer NAD4 may be disposed between the sub region SR of the display module 210 and the rigid layer 240 (or the second plate 242), and the sub region SR of the display module 210 may be attached to the rigid layer 240.

A plurality of wirings may be disposed in the bent region BR and the sub region is SR. The wiring in the bent region BR may be connected to a circuit layer of the main region MR and may be extended to the sub-region SR. The wiring extended to the sub region SR may be connected to the circuit board 422.

The circuit board 422 may be a flexible printed circuit board. The circuit board 422 may be provided, but is not limited to, in the form of film-on-plastic. For example, the upper surface of an end of the circuit board 422 may be attached on the wire on the lower surface of the display module 210 in the sub region SR. The circuit board 422 may be attached via an anisotropic conductive film.

A protective layer 411 (or a bent region protective layer) may be disposed on the display module 210 in the bent region BR and the sub region SR. The protective layer 411 covers and protects driving wiring. In addition, the protective layer 411 may reinforce the strength of a flexible substrate or to mitigate stress in the bent region BR. The protective layer 411 exposes a part of the wiring (e.g., wiring pad) located in the sub region SR.

A part of the protective layer 411 may be extended to the main region MR of the display module 210. Even if the protective layer 411 is disposed on the main region MR, the protective layer 411 may be located in the non-display area NDA of the main region MR, and may not be extended to the display area DPA. The protective layer 411 may not overlap the flexible function module (for example, a polarizing film).

In an exemplary embodiment, the protective layer 411 may include an organic coating layer, such as polyimide, acrylate, and epoxy. In another exemplary embodiment, the protective layer 411 may be attached in the form of a protective layer.

The protective layer 411 may have a thickness relatively less than the thickness of the flexible function module 221. In this case, contaminant DUST may be introduced between is the window module 222 and the protective layer 411 and accumulated on the side surface (or sidewall) of the functional module 221. The contaminant DUST may be introduced when the outer periphery of the window module 222 or the display module 210 is processed with a laser. The contaminant may be carbide. In addition, the window module 222 may be spaced apart from the protective layer 411 due to the thickness of the protective layer 411, such that the window module 222 may be bent without being supported thereby. Such problems rarely occur when the rigid glass is employed in existing devices. However, when the window module 222 having flexibility is employed, such a phenomenon may occur on the window module 222 during a laser process, which may generate contaminants such as carbide.

The outer side surface of the protective layer 411 at a center point B1 of the panel bent region BR may be on the same plane with an outer side surface S-3d of the flexible window module 222.

Figure 5:
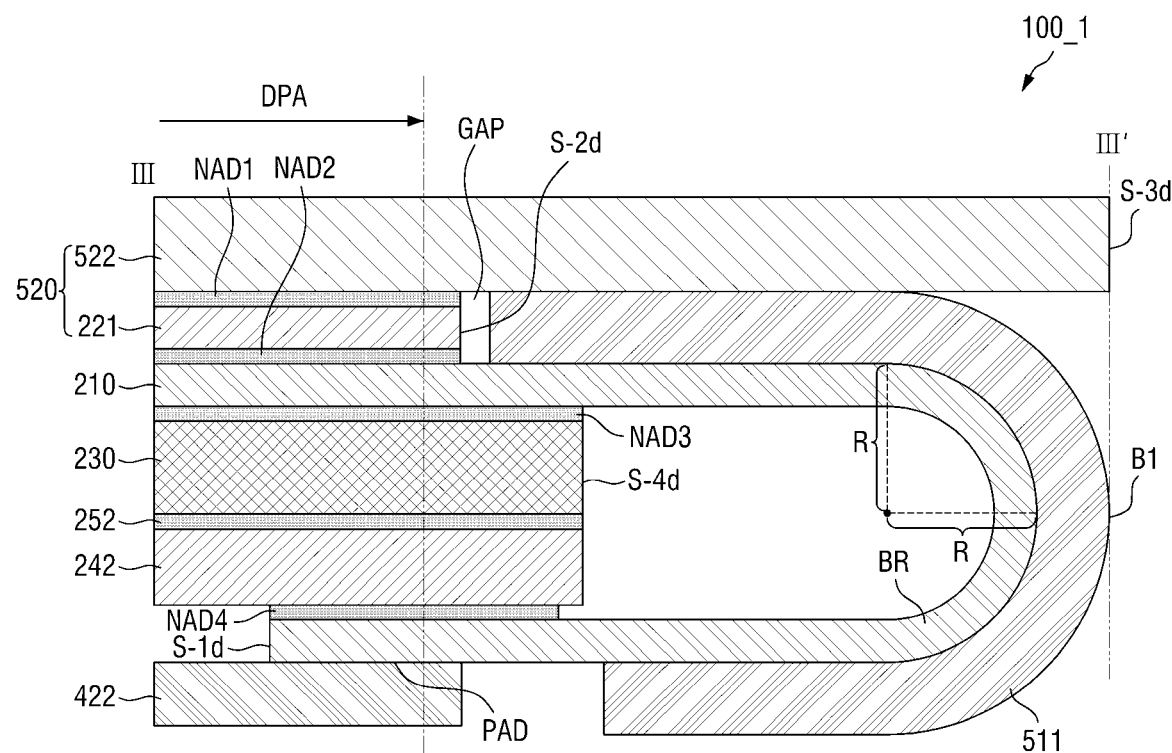
FIGS. 5, 6, 7, 8, 9, 10, 11, 12, 13, 14, and 15 are cross-sectional views of display devices according to exemplary embodiments.

Referring to FIG. 5, a display device 100_1 is substantially different from the display device 100 of FIG. 4 in that the display device 100_1 includes a protective layer 511 and an upper flexible module 520.

The protective layer 511 may be interposed between a flexible window module 522 and the display module 210. The protective layer 511 may be spaced apart from the flexible function module 221 by a predetermined gap GAP in the left-and-right direction. The predetermined gap GAP may be substantially zero. Then, one side surface of the protective layer 511 may be in contact with one side surface of the flexible function module 221.

The thickness of the protective layer 511 may be substantially equal to the total thickness of the flexible function module 221 and the first and second double-sided adhesive layers NAD1 and NAD2. For example, the thickness of the protective layer 511 may be is substantially equal to the sum of the thickness of the flexible function module 221, the thickness of the first double-sided adhesive layer NAD1, and the thickness of the second double-sided adhesive layer NAD2.

In this case, the protective layer 511 may fill between the display module 210 and the flexible window module 522 at the edge of the main region MR. Accordingly, it is possible to prevent contaminant DUST from being accumulated on the side surface of the flexible function module 221. Further, the flexible window module 522 can be supported by the protective layer 511.

The outer side surface S-3d of the flexible window module 522 may be on the same plane with the outer side surface of the protective layer 511 (i.e., the outer side surface of the protective layer 511 at the center point B1 of the panel bent region BR). The flexible window module 522 covers the portion of the protective layer 511 that protrudes in the left-and-right direction due to the thickness of the protective layer 511. The flexible window module 522 may completely overlap with or completely cover the protective layer 511. More particularly, the outer periphery of the flexible window module 522 may be in line with the outer periphery of the protective layer 511. Accordingly, the protective layer 511 can be protected from an impact at the outer periphery, and the display device 100_1 can be mounted easily.

Figure 6:
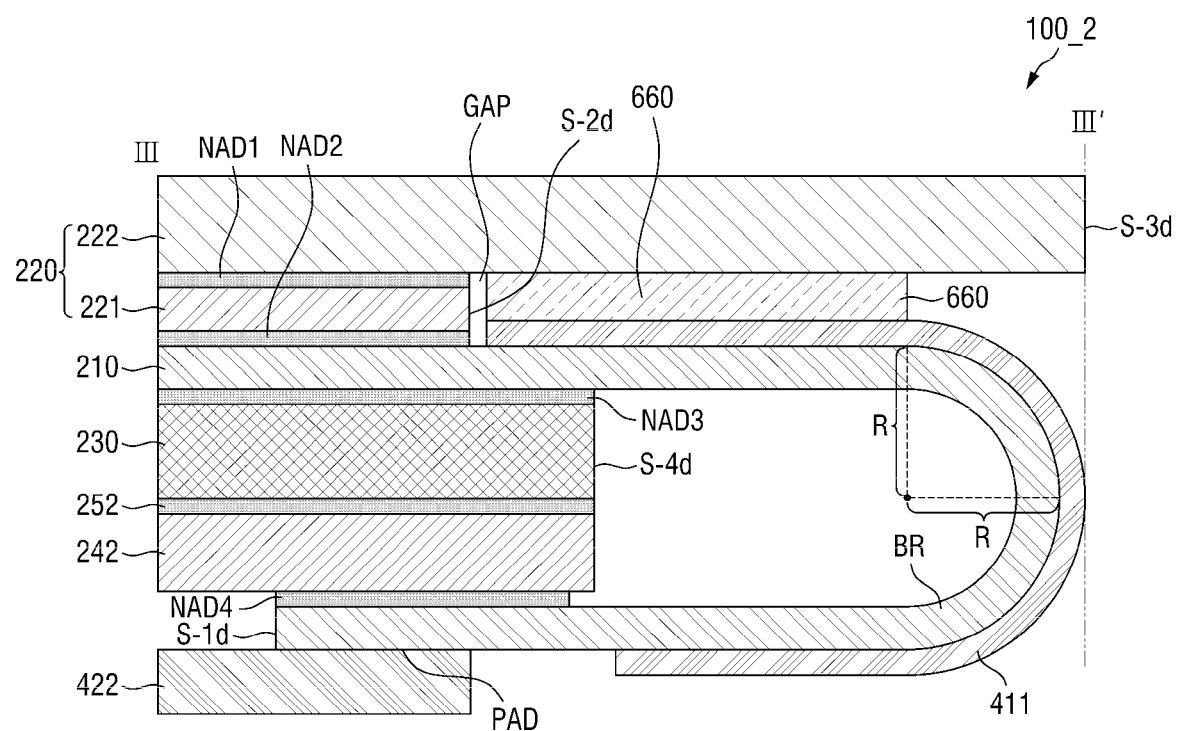

Referring to FIG. 6, the display device 100_2 is substantially different from the display device 100 of FIG. 4 in that the display device 100_2 further includes a height-compensating layer 660.

The height-compensating layer 660 may be disposed between the flexible window module 222 and the protective layer 411. The height-compensating layer 660 may overlap the main region MR of the display module 210 (or the protective layer 411 in the main region MR of is the display module 210). The inner side surface of the height-compensating layer 660 may coincide with the inner side surface of the protective layer 411. The height-compensating layer 660 may be spaced apart from the flexible function module 221 in the left-and-right direction by a predetermined gap GAP. The predetermined gap GAP may be substantially zero. Then, the inner side surface of the height-compensating layer 660 may be in contact with the outer side surface of the flexible function module 221.

The sum of the thickness of the height-compensating layer 660 and the thickness of the protective layer 441 may be substantially equal to the total thickness of the flexible function module 221 and the first and second double-sided adhesive layers NAD1 and NAD2. In this case, the height-compensating layer 660 may be used to fill between the display module 210 (or the protective layer 411) and the flexible window module 222 at the edge of the main region MR. Accordingly, it is possible to prevent contaminant DUST from being accumulated on the side surface of the flexible function module 221. Further, the flexible window module 222 can be supported by the height-compensating layer 660.

Figure 7:
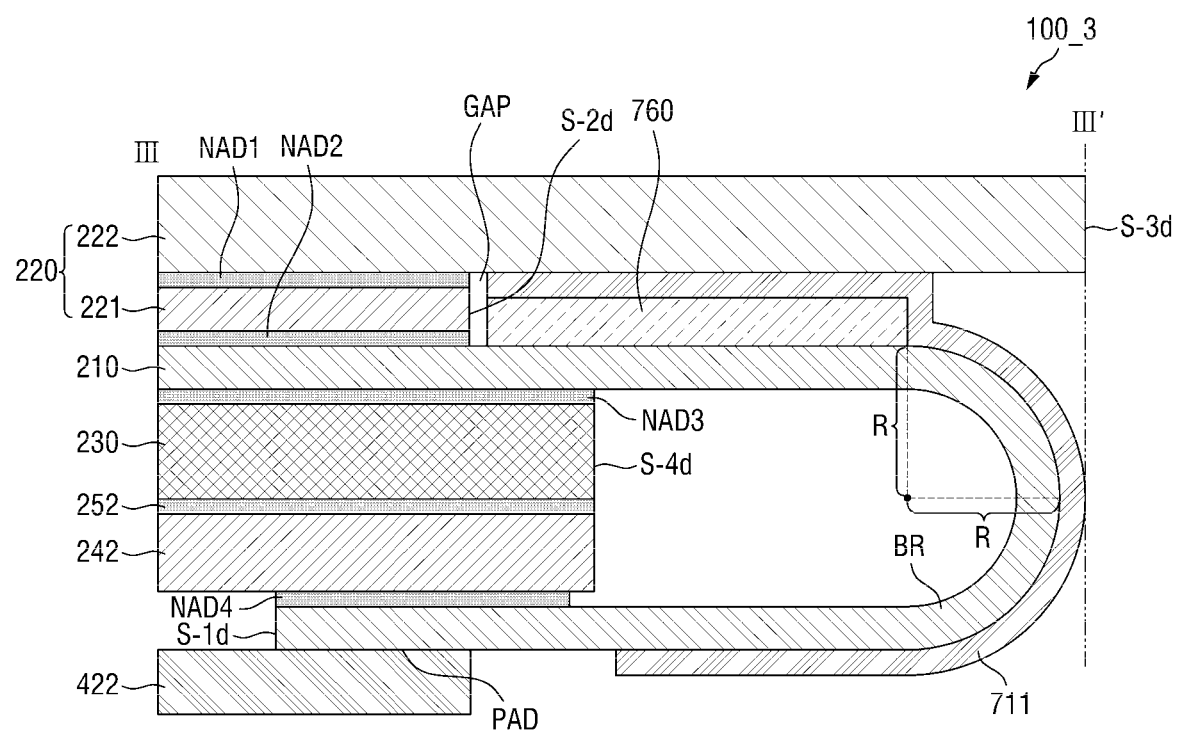

Referring to FIG. 7, a display device 100_3 is substantially different from the display device 100_2 of FIG. 6 in that the display device 100_3 further includes a height-compensating layer 760.

The height-compensating layer 760 may be substantially identical to or substantially similar to the height-compensating layer 660 described above with reference to FIG. 6. In particular, the thickness, the length (i.e., the length in the left-and-right direction), and the position in the left-and-right direction of the height-compensating layer 760 (i.e., the position at which it overlaps with the display module 210) may be substantially the same as those of the height-compensating layer 660 shown in FIG. 6, respectively. Therefore, repeated descriptions of the identical elements will be omitted to avoid redundancy.

The height-compensating layer 760 may be disposed on the display module 210.

The protective layer 711, similarly to the protective layer 411 described above with reference to FIG. 4, may be disposed in the bent region BR and the sub region SR, and may be disposed over the height-compensating layer 760. Specifically, the protective layer 711 may be disposed between the height-compensating layer 760 and the flexible window module 222 in the main region MR of the display module 210. In particular, the height-compensating layer 760 may be disposed between the display module 210 and the protective layer 711.

The inner side surface of the height-compensating layer 760 may be in line with the inner side surface of the protective film 411. The height-compensating layer 760 may be spaced apart from the flexible function module 221 in the left-and-right direction by a predetermined gap GAP. The predetermined gap GAP may be substantially zero.

The sum of the thickness of the height-compensating layer 760 and the thickness of the protective layer 711 may be substantially equal to the total thickness of the flexible function module 221 and the first and second double-sided adhesive layers NAD1 and NAD2. Accordingly, it is possible to prevent contaminant DUST from being accumulated on the side surface of the flexible function module 221. Further, the flexible window module 522 can be supported by the protective layer 711

Figure 8:
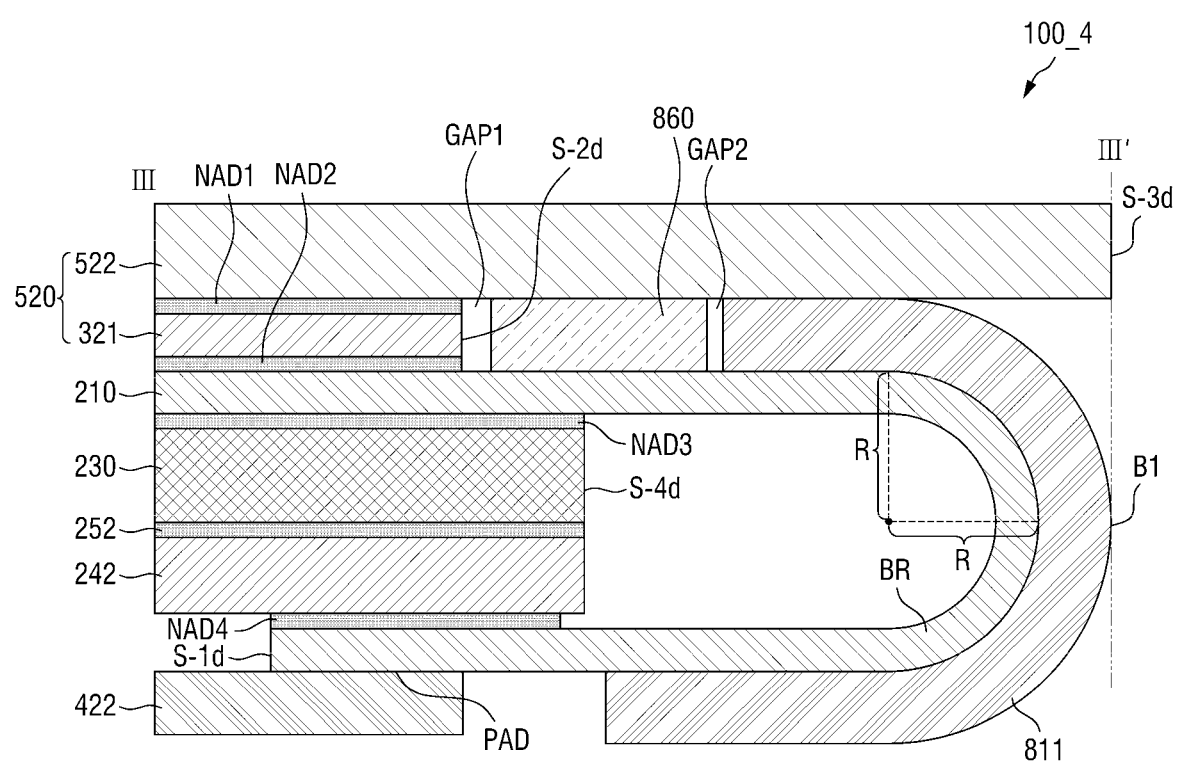

Referring to FIG. 8, a display device 100_4 is substantially different from the display device 100_1 of FIG. 5 in that the display device 100-4 includes a protective layer 811 and a height-compensating layer 860.

The height-compensating layer 860 may be disposed between the display module 210 and the flexible window module 522. The height-compensating layer 860 may overlap with the main region MR of the display module 210. The height-compensating layer 860 may be spaced apart from the flexible function module 221 in the left-and-right direction by a first predetermined gap GAP1. The first gap GAP1 may be substantially zero.

The thickness of the height-compensating layer 860 may be substantially equal to the total thickness of the flexible function module 221 and the first and second double-sided adhesive layers NAD1 and NAD2.

The protective layer 811, similarly to the protective layer 511 described above with reference to FIG. 5, may be interposed between the flexible window module 522 and the display module 210. The protective layer 811 may be spaced apart from the height-compensating layer 860 by a second gap GAP2 in the left-and-right direction. The second gap GAP2 may be substantially zero.

The thickness of the protective layer 811 may be substantially equal to the total thickness of the flexible function module 221 and the first and second double-sided adhesive layers NAD1 and NAD2.

In this case, the height-compensating layer 860 and the protective layer 811 may be used to fill between the display module 210 and the flexible window module 222 at the edge of the main region MR. Accordingly, it is possible to prevent contaminant DUST from being accumulated on the side surface of the flexible function module 221. Further, the flexible window module 522 can be supported by them.

Figure 9:
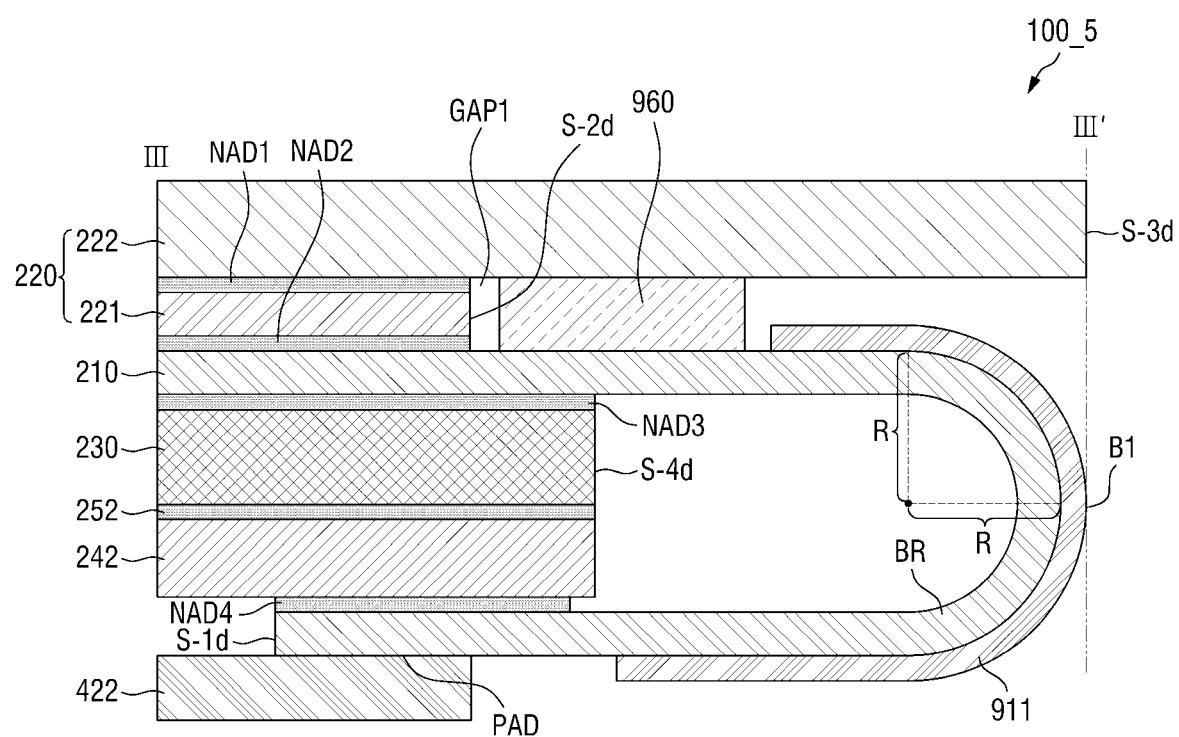

Referring to FIG. 9, a display device 100_5 is substantially different from the display device 100_5 of FIG. 8 in that the display device 100_5 includes a protective layer 911 and a height-compensating layer 960.

The height-compensating layer 960 may be substantially identical to or is substantially similar to the height-compensating layer 860 described above with reference to FIG. 8. Therefore, repeated descriptions of the identical elements will be omitted to avoid redundancy. The length of the height-compensating layer 960 in the left-and-right direction may be relatively greater than the length of the height-compensating layer 860. However, the inventive concepts are not limited thereto. For example, the length of the height-compensating layer 960 may be substantially equal to or relatively less than the length of the height-compensating layer 860.

The protective layer 911 may be disposed on the display module 210 (or the bent region BR and the sub region SR of the display module 210), and may be adjacent to or spaced from a flexible function module 221. The thickness of the protective layer 911 may be substantially equal to the thickness of the protective layer 411 described above with reference to FIG. 4.

The height-compensating layer 960 may be used to fill between the display module 210 and the flexible window module 222 at the edge of the main region MR.

Figure 10:
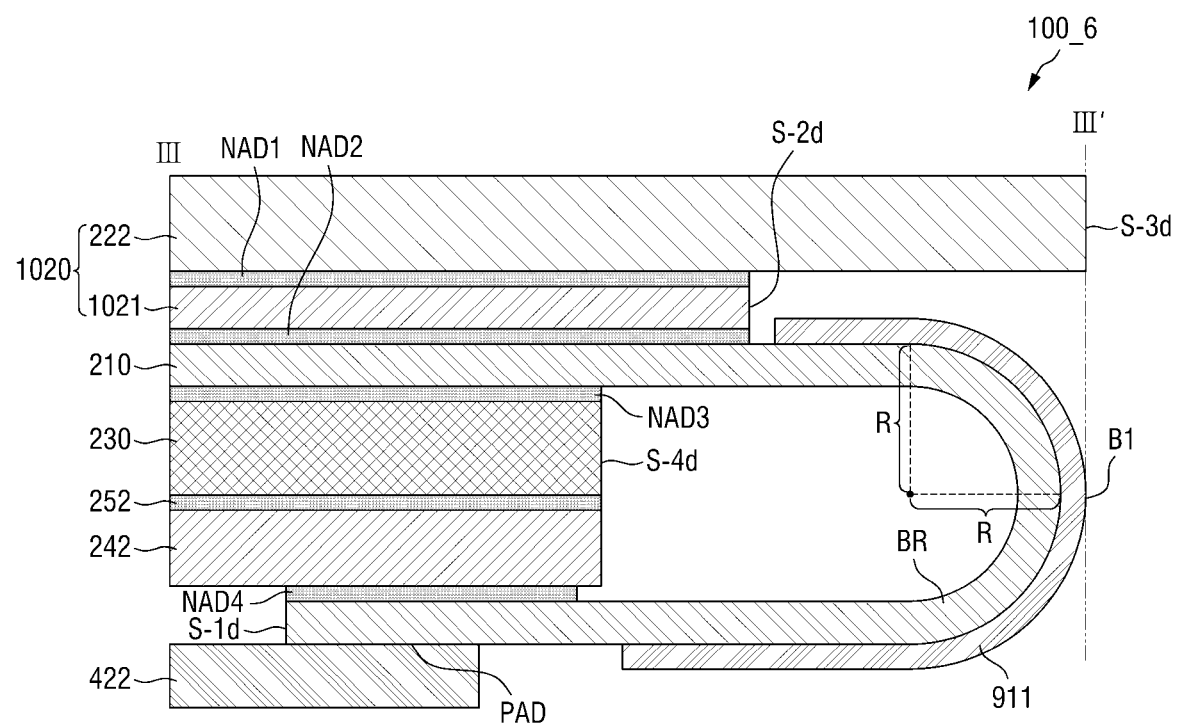

Referring to FIG. 10, a display device 100_6 is substantially different from the display device 100 of FIG. 4 in that the display device 100_6 includes an upper flexible module 1020.

The upper flexible module 1020 may include a flexible function module 1021.

The flexible function module 1021 may be disposed on the display module 210 up to the edge of the main region MR of the display module 210. In this case, the outer side surface S-2d of the flexible function module 1021 may protrude outward (e.g., right side) from the outer side surface S-4d of the lower flexible module 230.

The flexible function module 1021 may be used to fill between the display is module 210 and the flexible window module 222 at the edge of the main region MR. Accordingly, the flexible function module 1021 may support the flexible window module 222. In addition, even if foreign matter is accumulated on the side surface of the flexible function module 221, the location where the foreign matter is accumulated is relatively distant from the display area DPA of the display module 210, so that the influence of the foreign matter on the display module 210 may be reduced.

Figure 11:
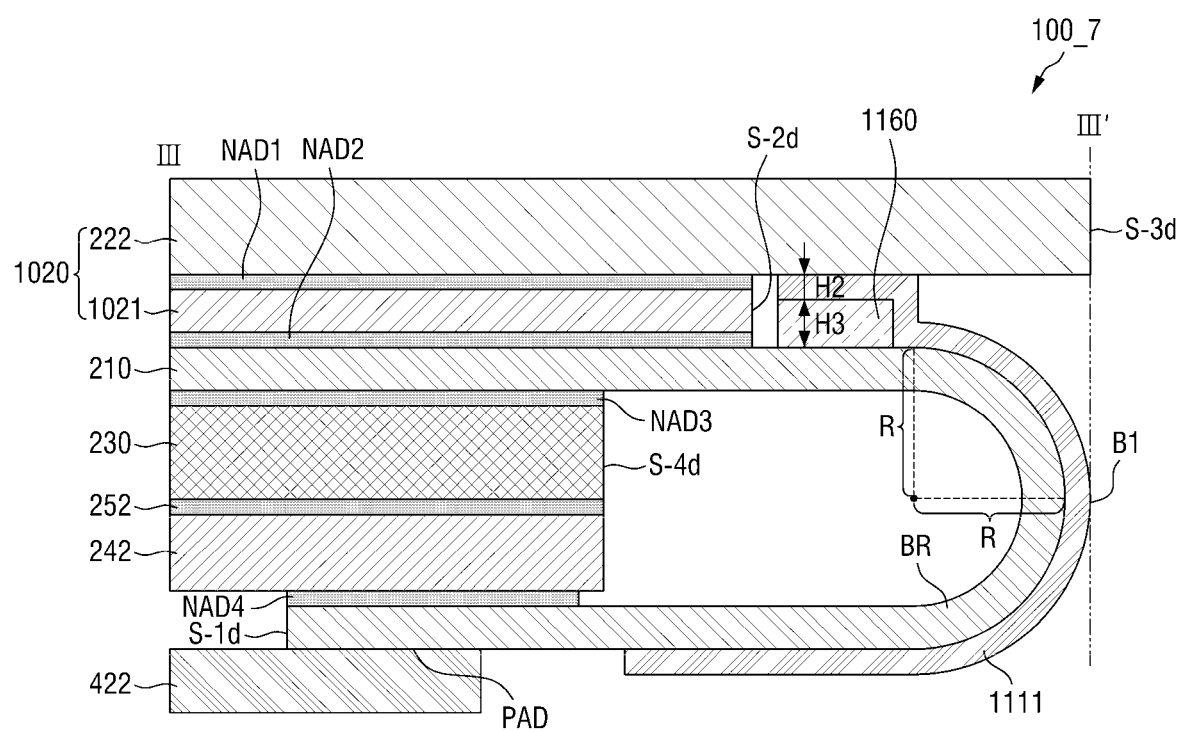

Referring to FIG. 11, a display device 100_7 is substantially different from the display device 100_6 of FIG. 10 in that the display device 100_7 includes a height-compensating layer 1160 and a protective layer 1111.

Similarly to the height-compensating layer 760 described above with reference to FIG. 7, the height-compensating layer 1160 may be disposed on the display module 210.

The protective layer 1111, similarly to the protective layer 711 described above with reference to FIG. 7, may be disposed in the bent region BR and the sub region SR and may be disposed over the height-compensating layer 1160. In particular, the height-compensating layer 1160 may be disposed between the display module 210 and the protective layer 1111.

The sum of the thickness of the height-compensating layer 1160 and the thickness of the protective layer 1111 may be substantially equal to the total thickness of the flexible function module 221 and the first and second double-sided adhesive layers NAD1 and NAD2. Accordingly, due to the height-compensating layer 1160, the protective layer 1111, and the flexible function made of 1021, it is possible to prevent contaminant DUST from being accumulated on the side surface of the flexible function module 1021. Further, the flexible window module 222 can be supported by them.

Figure 12:
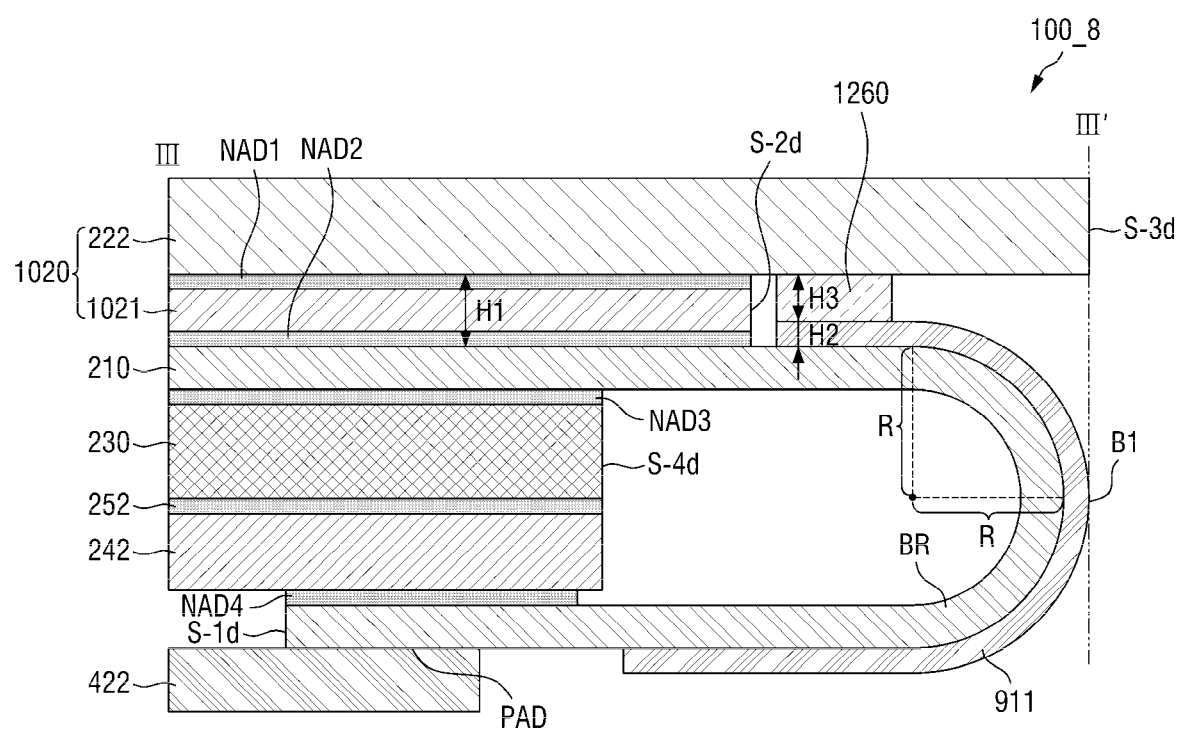

Referring to FIG. 12, a display device 100_8 is substantially different from the display device 100_5 of FIG. 9 in that the display device 100_8 further includes a height-compensating layer 1260.

The height-compensating layer 1260 may be disposed between the flexible window module 222 and the protective layer 911. The height-compensating layer 1260 may overlap the main region MR of the display module 210 (or the protective layer 911 in the main region MR of the display module 210). The inner side surface of the height-compensating layer 1260 may be in line with the inner side surface of the protective layer 911. The height-compensating layer 1260 may be adjacent to the flexible function module 1021 in the left-and-right direction.

The sum of the thickness H2 of the protective layer 911 and the thickness H3 of the height-compensating layer 1260 may be substantially equal to the total thickness H1 of the flexible function module 1021 and the first and second double-sided adhesive layers NAD1 and NAD2. The height-compensating layer 1260 may be used to fill between the display module 210 (or the protective layer 911) and the flexible window module 222 at the edge of the main region MR.

Figure 13:
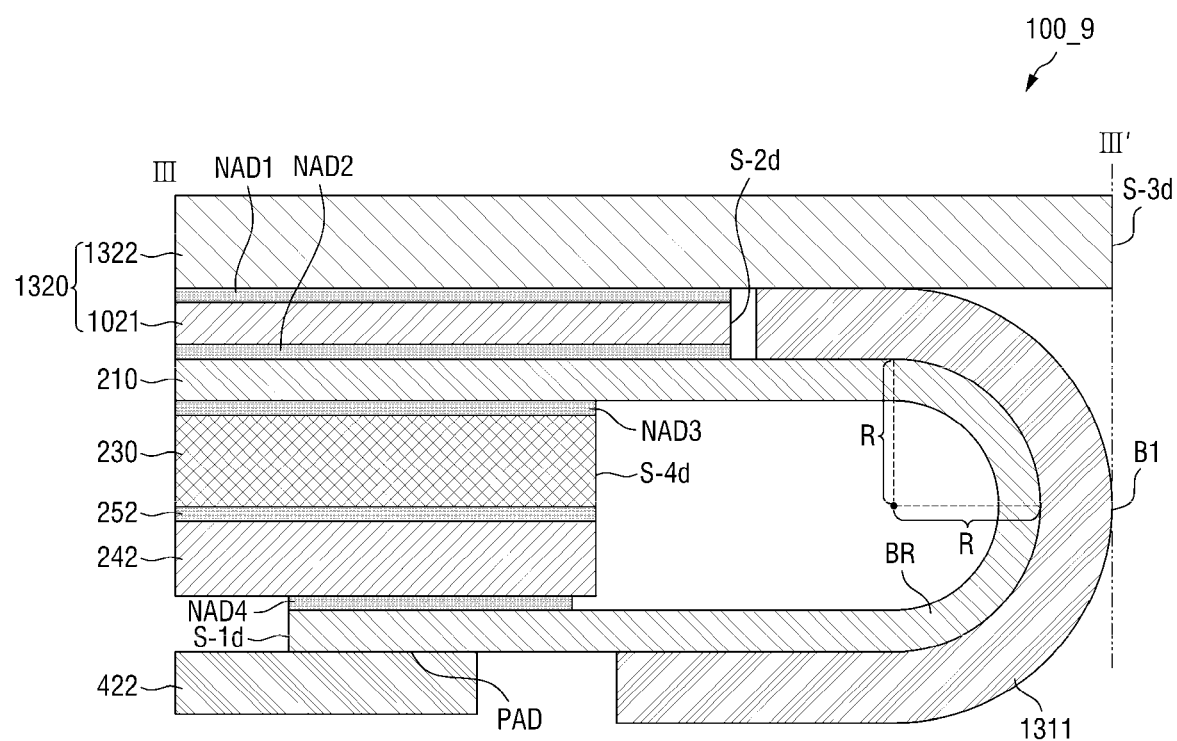

Referring to FIG. 13, a display device 100_9 is substantially different from the display device 100 of FIG. 5 in that the display device 100_9 includes a protective layer 1311 and an upper flexible module 1320.

The upper flexible module 1320 includes a flexible function module 1021. The flexible function module 1021 may be substantially identical to or substantially similar to the flexible function module 1021 described above with reference to FIG. 10. Further, the protective layer 1311 may be substantially identical to or substantially similar to the protective layer 511 described above with reference to FIG. 5. Therefore, repeated descriptions of the substantially identical elements will be omitted to avoid redundancy.

The protective layer 1311 may be disposed between the flexible window module 1322 and the display module 210 and may be spaced apart from or adjacent to the flexible function module 1021 by a predetermined gap GAP in the left-and-right direction.

The thickness of the protective layer 1311 may be substantially equal to the total thickness of the flexible function module 1021 and the first and second double-sided adhesive layers NAD1 and NAD2.

The outer side surface S-3d of the flexible window module may be in line with the outer side surface of the protective layer 1311 (i.e., the outer side surface at the center point B1 of the bent region BR).

The protective layer 1311 (and the flexible function module 1021) may be used to fill between the display module 210 and the flexible window module 1322 at the edge of the main region MR. Further, the flexible window module 1322 can be supported by them.

Figure 14:
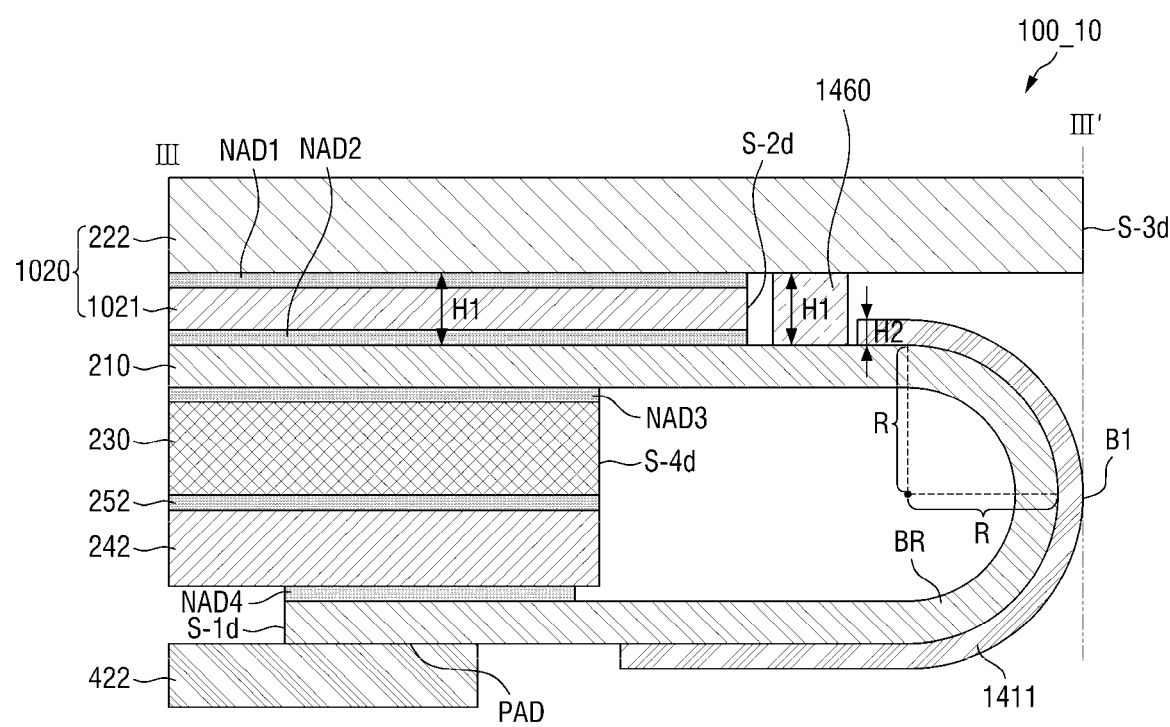

Referring to FIG. 14, a display device 100_10 is substantially different from the display device 100_6 of FIG. 10 in that the display device 100_10 includes a height-compensating layer 1460 and a protective layer 1411.

The height-compensating layer 1460 may be substantially identical to or substantially similar to the height-compensating layer 860 described above with reference to FIG. 8. Therefore, repeated descriptions of the identical elements will be omitted to avoid redundancy. The length of the height-compensating layer 960 in the left-and-right direction may be relatively greater than the length of the height-compensating layer 860. However, the inventive concepts are not limited thereto. For example, the length of the height-compensating layer 960 may be substantially equal to or relatively less than the length of the height-compensating layer 860.

More specifically, the height-compensating layer 1460 may be disposed between the display module 210 and the flexible window module 222 at the edge of the main region MR of the display module 210. The height-compensating layer 1460 may be adjacent to or spaced apart from the flexible function module 1021 in the left-and-right direction by a predetermined gap.

The thickness of the height-compensating layer 1460 may be substantially equal to the total thickness of the flexible function module 1021 and the first and second double-sided adhesive layers NAD1 and NAD2.

The protective layer 1411 may be disposed on the display module 210 (or the bent region BR and the sub region SR of the display module 210) and may be adjacent to or spaced from the flexible function module 1021. The thickness H2 of the protective layer 1411 may be relatively less than the thickness H1 of the height-compensating layer 1460 and may be substantially equal to the thickness of the protective layer 911 described with reference to FIG. 10.

Figure 15:
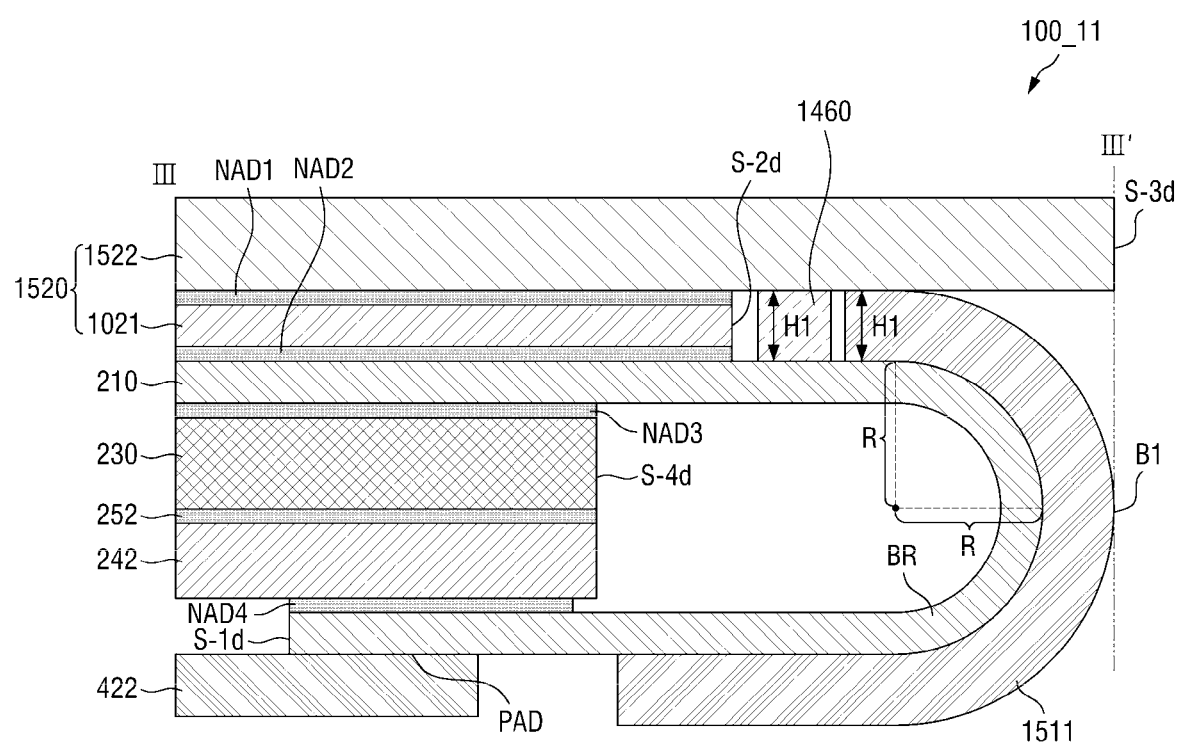

Referring to FIG. 15, a display device 100_11 is substantially different from the display device 100_10 of FIG. 14 in that the display device 100_11 includes a protective layer 1511 and an upper flexible module 1520.

The protective layer 1511 may be disposed similarly to the protective layer 1411 described above with reference to FIG. 14, and the thickness of the protective layer 1511 may be substantially equal to the thickness H1 of the height-compensating layer 1460.

The upper flexible module 1520 includes a flexible window module 1522. The flexible window module 1522 may be substantially identical to or substantially similar to the flexible window module 222 shown in FIG. 14. The outer side surface S-3d of the flexible window module 1522 may be in line with the outer side surface of the protective layer 1511 at the center point B1.

FIGS. 16 to 20 are cross-sectional views of display devices according to exemplary embodiments.

Figure 16:
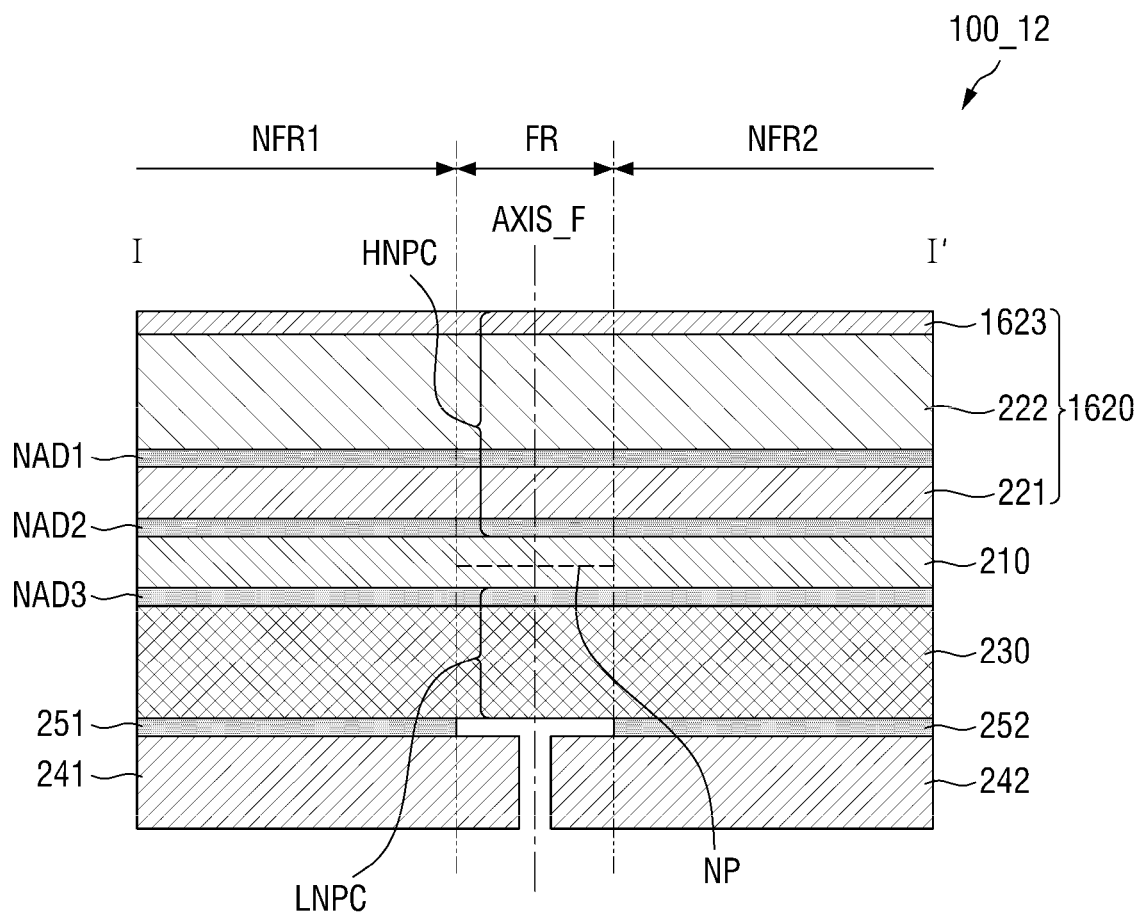
FIGS. 16, 17, 18, 19, and 20 are cross-sectional views of display devices according to exemplary embodiments.

Referring to FIG. 16, a display device 100_12 is substantially different from the display device 100 of FIG. 2 in that the display device 100_12 includes an upper flexible module 1620.

The upper flexible module 1620 may further include a solid glass layer 1623 (or a solidified glass layer), as compared to the upper flexible module 220 described above with reference to FIG. 2.

The solid glass layer 1623 may be disposed or formed on the flexible window module 222. For example, the solid glass layer 1623 may be formed by thinly depositing a glass precursor on a flexible window module 222, which is then melted and solidified by cooling. As another example, after a preliminary layer is formed with a precursor on a separate substrate, the preliminary layer is heated to be melt. Then, the melted preliminary layer is cooled again to be solidified as a separate solid glass layer (e.g., the solid glass layer 1623 in the form of film). Subsequently, the separate solid glass layer 1623 may be attached on the flexible window module 222 via a lamination process.

The solid glass layer 1623 may include a material that has a low glass transition temperature (Tg) and also has a low liquidus temperature (LLT).

For example, the solid glass layer 1623 may include a material having a glass transition temperature of 160 degrees or less. Then, the heat treatment temperature for the solid glass layer 1623 (i.e., the heat treatment temperature of the solidification to remove defects (or pores) of the solid glass layer 1623) is relatively low. Therefore, it is possible to prevent the heat from being transmitted to the display module 210, and to prevent the intermediate layer IL of the display module 210 from being damaged by heat. The heat treatment may be carried out in a vacuum or an inert atmosphere. By maintaining low-moisture and oxygen-free conditions, it is possible to prevent moisture or oxygen from permeating between the thin film encapsulation structure of the display module 210 (i.e., the upper encapsulation multilayer and the lower encapsulation multilayer described above with reference to FIG. 2). The material having a low glass transition temperature may contain 55 to 75 wt % of stannum (Sn), 4 to 14 wt % of phosphorus (P), 6 to 24 wt % of oxygen (O), 4 to 22 wt % of fluorine (F), and 0.5 to 15 wt % of tungsten (W).

As another example, the solid glass layer 2623 may include a material having a liquidus temperature of 1,000° C. or less, 600° C. or less, and 400° C. or less. The heat treatment temperature to remove defects (or pores) in a material that has a low liquidus temperature is relatively low. Therefore, the solid glass layer 1623 without pores can be obtained at a relatively low temperature (i.e., a temperature at which the intermediate layer of the display module 210 is not damaged). The solid glass layer 1623 may include, as the material having a low liquidus temperature, tin fluoride phosphate glass, chalcogenide glass, tellurite glass, borate glass, and phosphate glass (e.g., alkaline zinc or tin zinc pyrophosphates). For example, the material having a low liquidus temperature may include 20 to 85 wt % of stannum (Sn), 2 to 20 wt % of phosphorus (P), 10 to 36 wt % of oxygen (O), 10 to 36 wt % of fluoro (F), and 0.5 to 5 wt % of niobium (Nb). The sum of the contents of tin, phosphorus, oxygen and fluorine may be 75% by weight.

The solid glass layer 1623 has a thickness relatively less than ultra-thin glass (UTG), so that it can reduce the folding radius of curvature (or the radius of curvature of the foldable region FR, the bending radius of curvature) significantly. For example, by employing the solid glass layer 1623, the folding radius of curvature can be reduced to 5 mm or less, and even to 4 mm or less.

In addition, by employing the solid glass layer 1623, it is possible to easily achieve a surface strength as desired by the material characteristics. For example, the surface of the solid glass layer 1623 can be chemically treated to a certain depth to increase the surface strength. For example, the surface strength of the solid glass layer 1623 can be improved by exchanging sodium ions contained in the solid glass layer 1623 with potassium ions (i.e., potassium ions relatively larger in size than sodium ions) via chemical treatment.

When the display device 100 is completely folded, one end (or the upper surface of the one end) and the other end (or the upper surface of the other end) of the solid glass layer 1623 may come in contact with each other. In doing so, an impact may occur between the one end and the other end, such that damage (e.g., a crack) may be created on the top surface of the display device 100 or the like. Therefore, by employing the solid glass layer 1623, it is possible to prevent damage (e.g., a crack) to the display device 100 by achieving a relatively high surface strength.

On the other hand, the solid glass layer 1623 may be included in the high neutral plane control portion (HNPC) to place the neutral plane NP in the display module 210.

Figure 17:
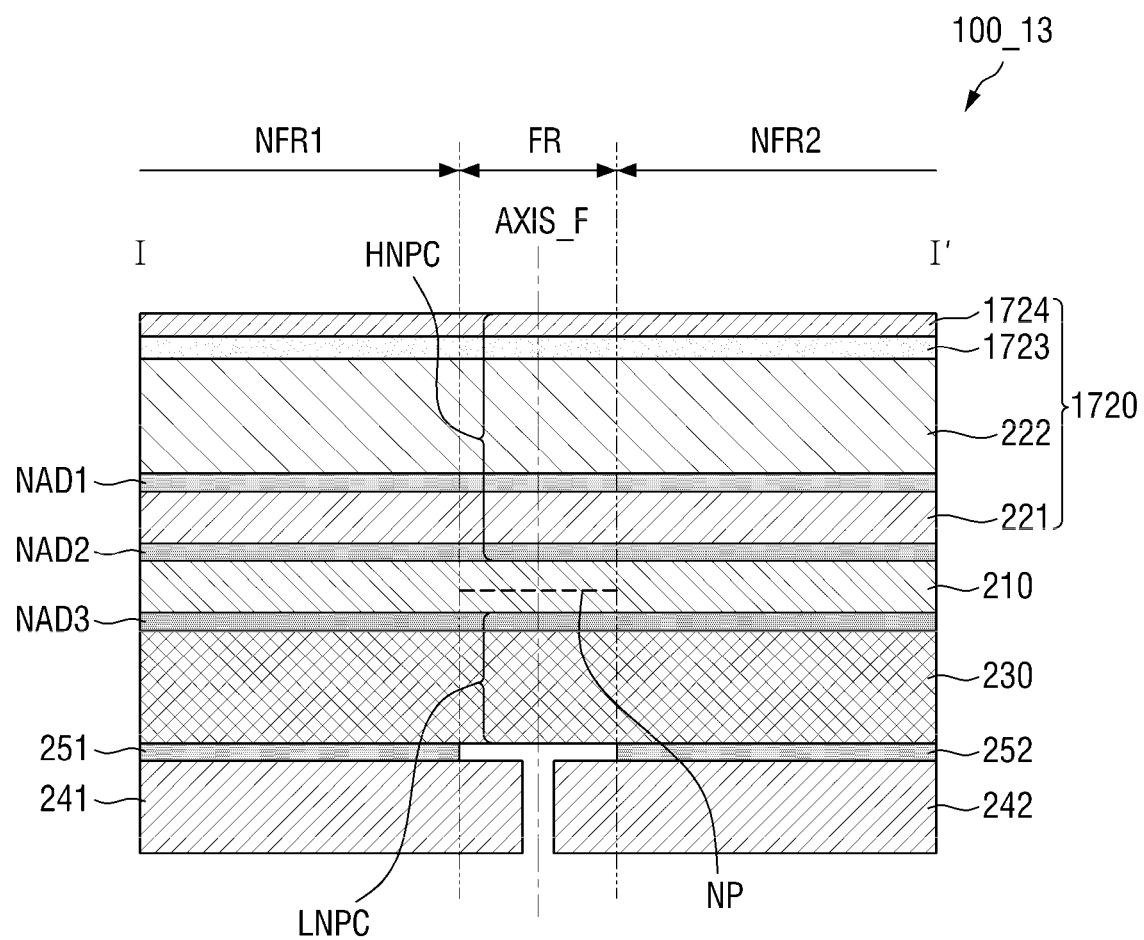

Referring to FIG. 17, a display device 100_13 is substantially different from the display device 100_12 of FIG. 16 in that the display device 100_13 includes an upper flexible module 1720.

The upper flexible module 1720 may further include a buffer layer 1723 as compared to the upper flexible module 1620 shown in FIG. 16. The solid glass layer 1724 may be substantially identical to the solid glass layer 1623 described above with reference to FIG. 16. Therefore, repeated descriptions of the substantially identical elements will be omitted to avoid redundancy.

The buffer layer 1723 may be interposed between the flexible window module 222 and the solid glass layer 1724. The buffer layer 1723 may be included in the high neutral plane control portion (HNPC).

The buffer layer 1723 may include an inorganic material such as amorphous silicon (a-Si), silicon nitride ($SiN_x$), and oxide ($SiO_x$). If the flexible window module 222 (or the surface of the flexible window module 222) includes an organic material, the buffer layer 1723 can increase the adhesion.

After the display module 210, the flexible function module 221, the flexible window module 222 and the like are integrated, the solid glass layer 1724 may be formed on the buffer layer 1723. When the solid glass layer 1724 is deposited on the buffer layer 1723 and then melted, the buffer layer 1723 containing the inorganic material may be used to prevent heat from being transferred to the upper flexible module 220 (or the flexible window module 222) and/or the display module 210.

Although the buffer layer 1723 is described as containing an inorganic material, the inventive concepts are not limited thereto, and the buffer layer 1723 may include an organic material. Then, the buffer layer 1723 may provide a flat surface over the solid glass layer 1724.

Figure 18:
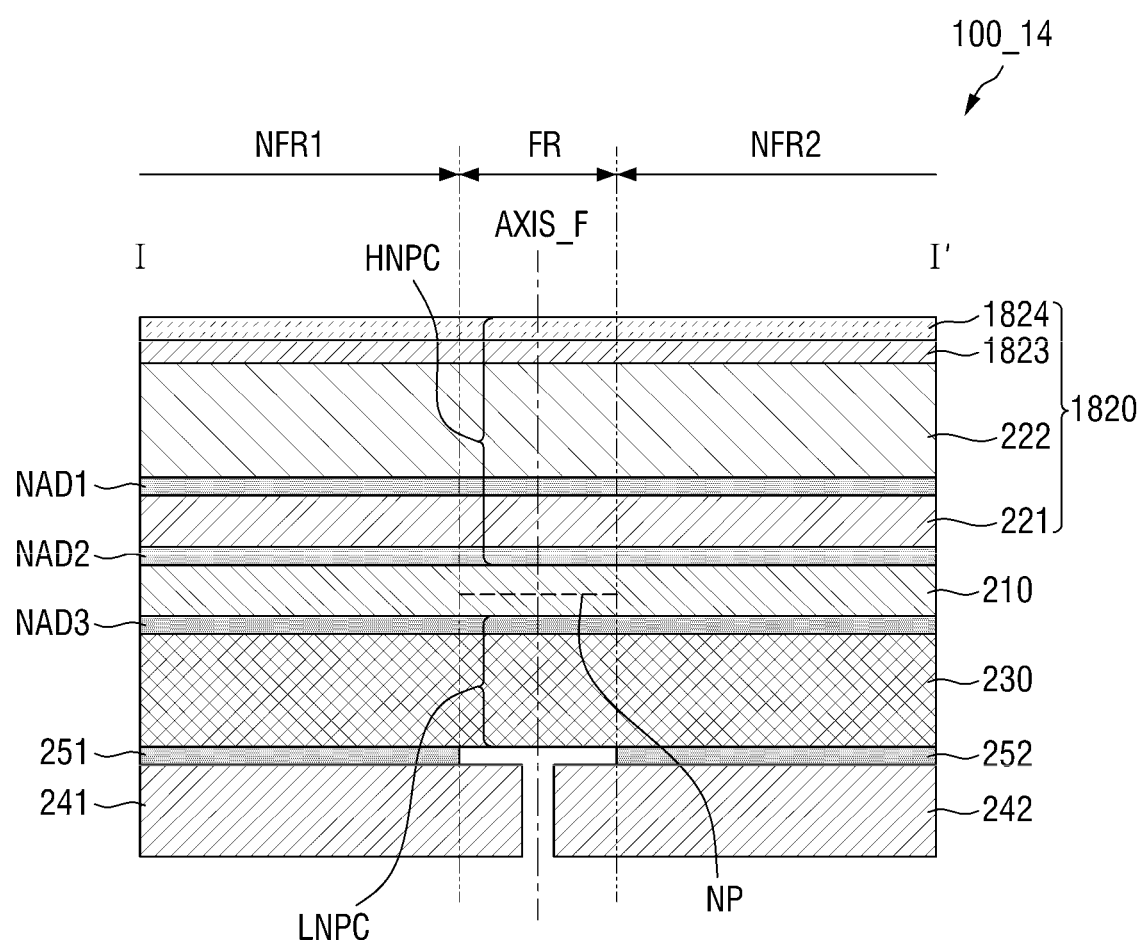

Referring to FIG. 18, a display device 100_14 is substantially different from the display device 100_12 of FIG. 16 in that the display device 100_14 includes an upper flexible module 1820.

The upper flexible module 1820 may further include a protective layer 1824 as compared to the upper flexible module 1620 shown in FIG. 16. The solid glass layer 1823 may be substantially identical to the solid glass layer 1623 described above with reference to FIG. 16, and thus, repeated descriptions of the substantially identical elements will be omitted to avoid redundancy.

The protective layer 1824 may be disposed on the solid glass layer 1823. The protective layer 1824 may be included in the high neutral plane control portion (HNPC).

The protective layer 1824 may include an inorganic material, such as amorphous silicon (a-Si), silicon nitride ($SiN_x$), and silicon oxide ($SiO_x$), similarly to the buffer layer 1723 described above with reference to FIG. 17.

The protective layer 1824 is disposed on the solid glass layer 1823, e.g., at the top of the display device 100_14, so that it is possible to prevent damage to the solid glass layer 1823 while the display device 100_14 is folded and unfolded repeatedly.

Figure 19:
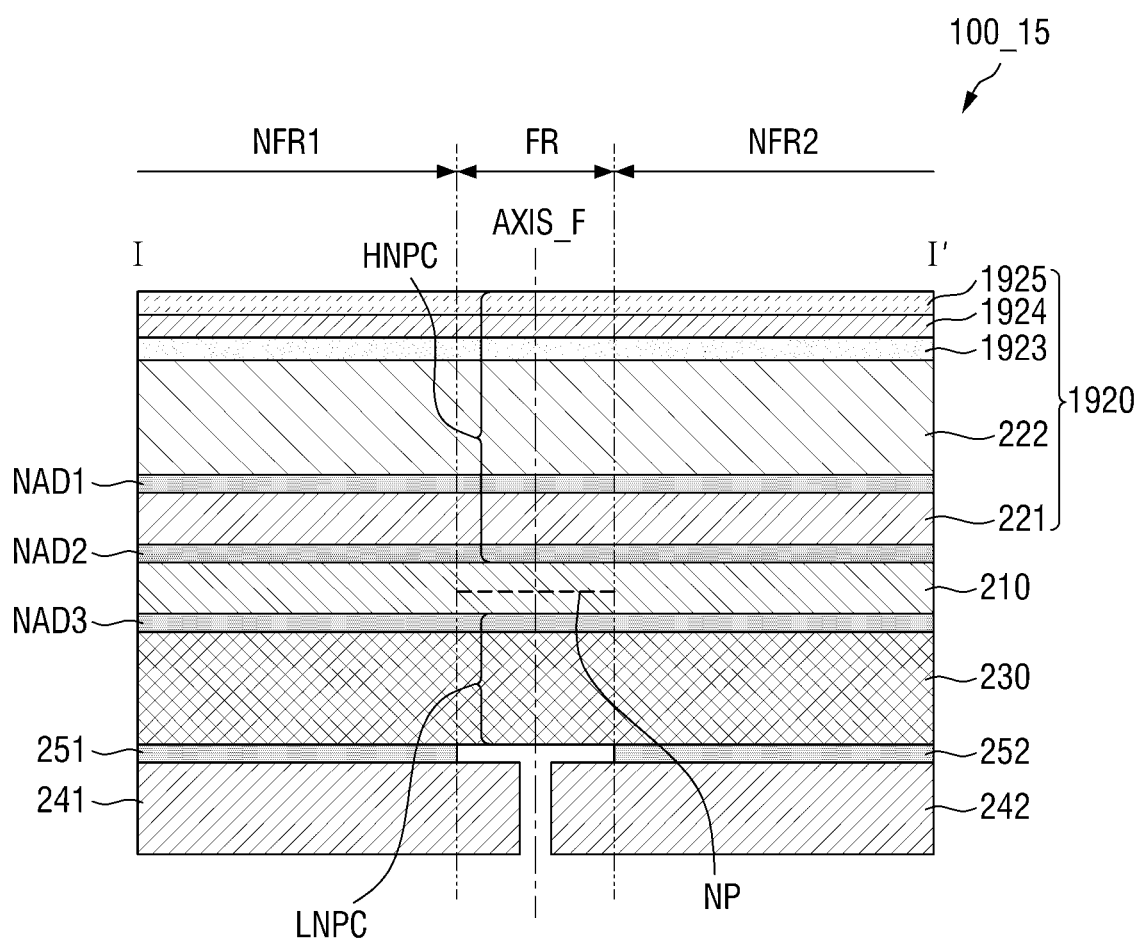

Referring to FIG. 19, a display device 100_15 is substantially different from the display device 100_13 of FIG. 17 (and the display device 100_14 of FIG. 18) in that the display device 100_15 includes an upper flexible module 1920.

The upper flexible module 1920 may include a flexible function module 221, a flexible window module 222, a buffer layer 1923, a solid glass layer 1924, and a protective layer 1925.

The buffer layer 1923, the solid glass layer 1924, and the protective layer 1925 may be included in a high neutral plane control portion (HNPC).

The buffer layer 1923 is substantially identical to the buffer layer 1723 described above with reference to FIG. 17. The solid glass layer 1924 is substantially identical to the solid glass layer 1623 described above with reference to FIG. 16. The protective layer 1925 is substantially identical to the protective layer 1824 described above with reference to FIG. 18. Therefore, repeated descriptions of the substantially identical elements will be omitted to avoid redundancy.

The adhesion of the solid glass layer 1924 can be increased by the buffer layer 1923 and the protective layer 1925, and damage can be suppressed.

Figure 20:
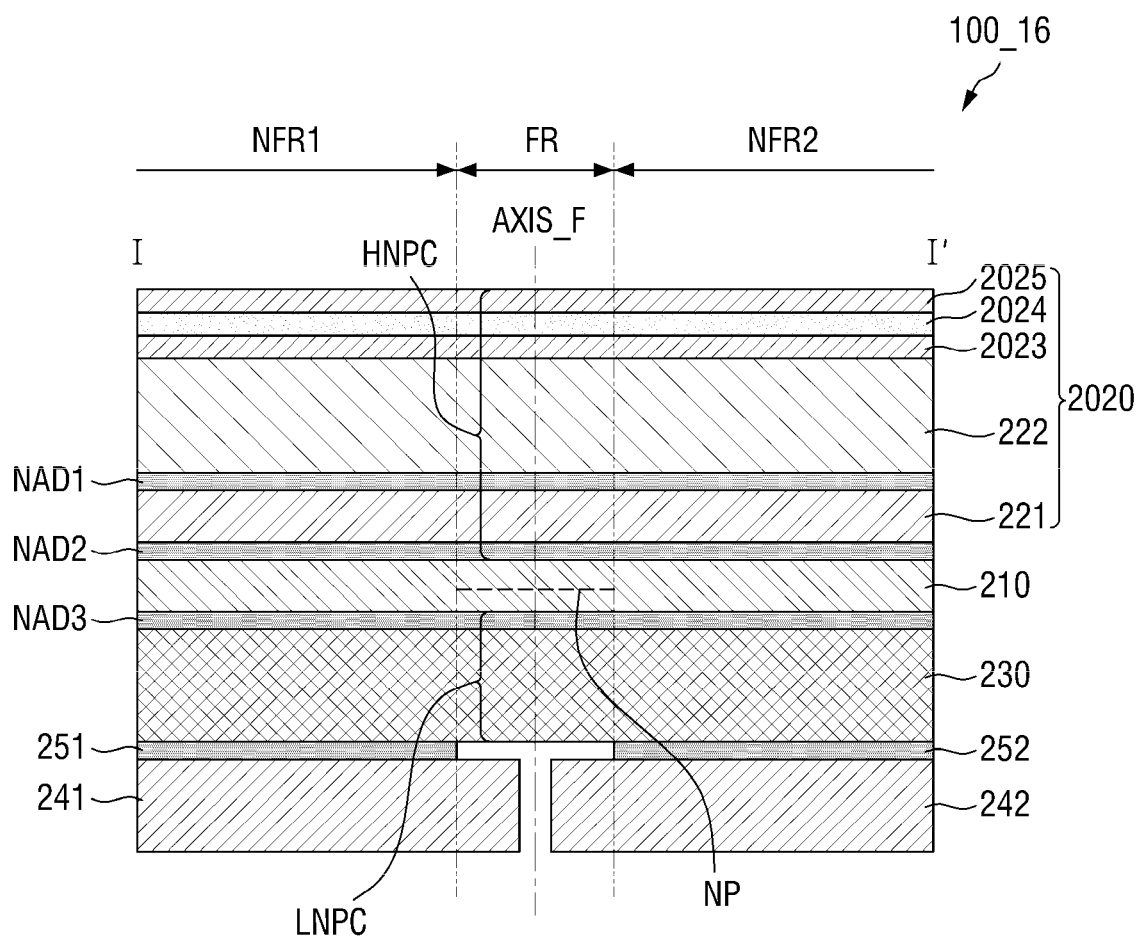

Referring to FIG. 20, a display device 100_16 is substantially different from the display device 100_14 of FIG. 18 in that the display device 100_16 includes an upper flexible module 2020.

The upper flexible module 2020 may include a flexible function module 221, a flexible window module 222, a first solid glass layer 2023, an intermediate layer 2024, and a second solid glass layer 2025.

Each of the first solid glass layer 2023 and the second solid glass layer 2025 may be substantially identical to the solid glass layer 1623 described above with reference to FIG. 16. Therefore, repeated descriptions of the substantially identical elements will be omitted made to avoid redundancy. The intermediate layer 2024 may include an inorganic material such as amorphous silicon (a-Si), silicon nitride ($SiN_x$) and silicon oxide ($SiO_x$) or an organic material, similarly to the buffer layer 1723 described above with reference to FIG. 7.

The first solid glass layer 2023 may be disposed or formed on the flexible window module 222. The intermediate layer

2024 may be disposed or formed on the first solid glass layer 2023. The second solid glass layer 2025 may be disposed or formed on the intermediate layer 2024. More particular, the first solid glass layer 2023, the intermediate layer 2024, and the second solid glass layer 2025 may be stacked on the flexible window module 222 in sequence.

The strength of the surface of the display device 100_16 can be increased by the first solid glass layer 2023 and the second solid glass layer 2025. Damage to the first solid glass layer 2023 and the second solid glass layer 2025 can be prevented by the intermediate layer 2024.

Figure 21:
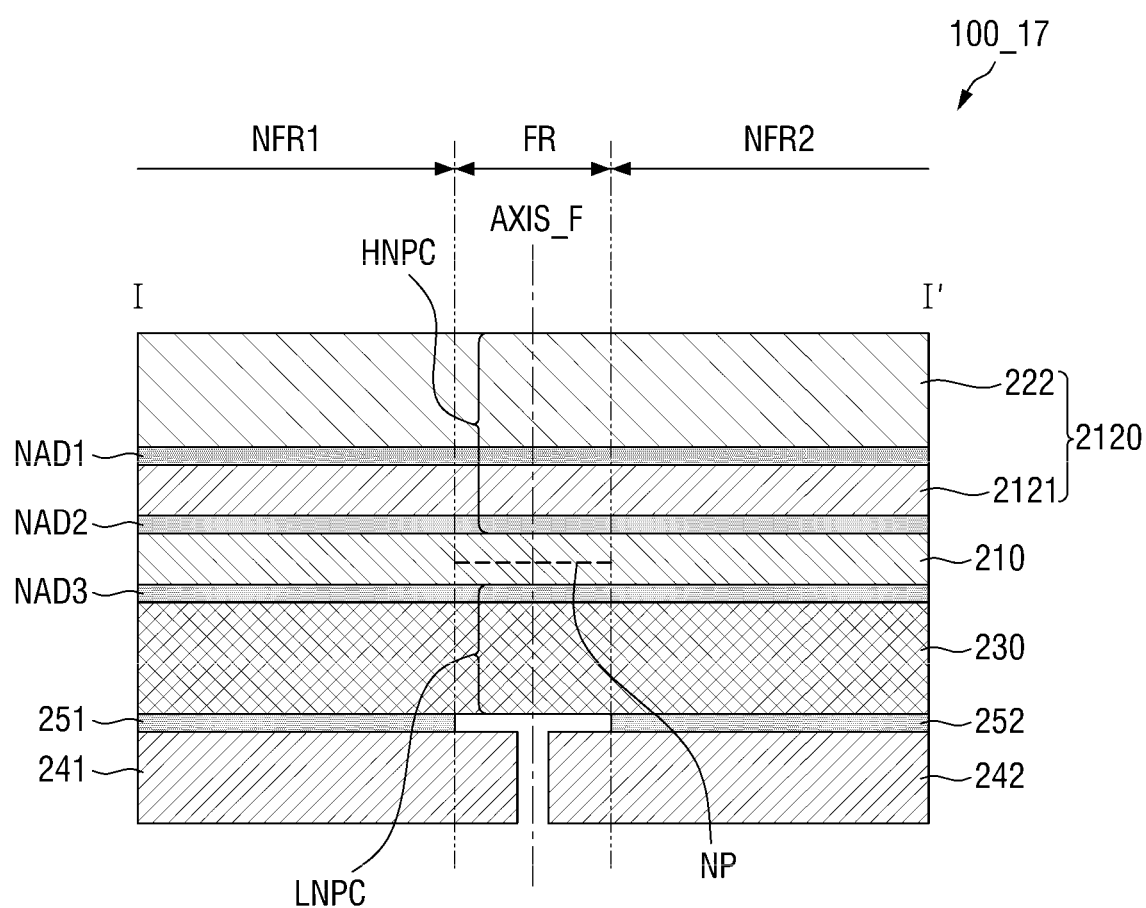
FIG. 21 is a cross-sectional view of a display device according to another exemplary embodiment.
Figure 22:
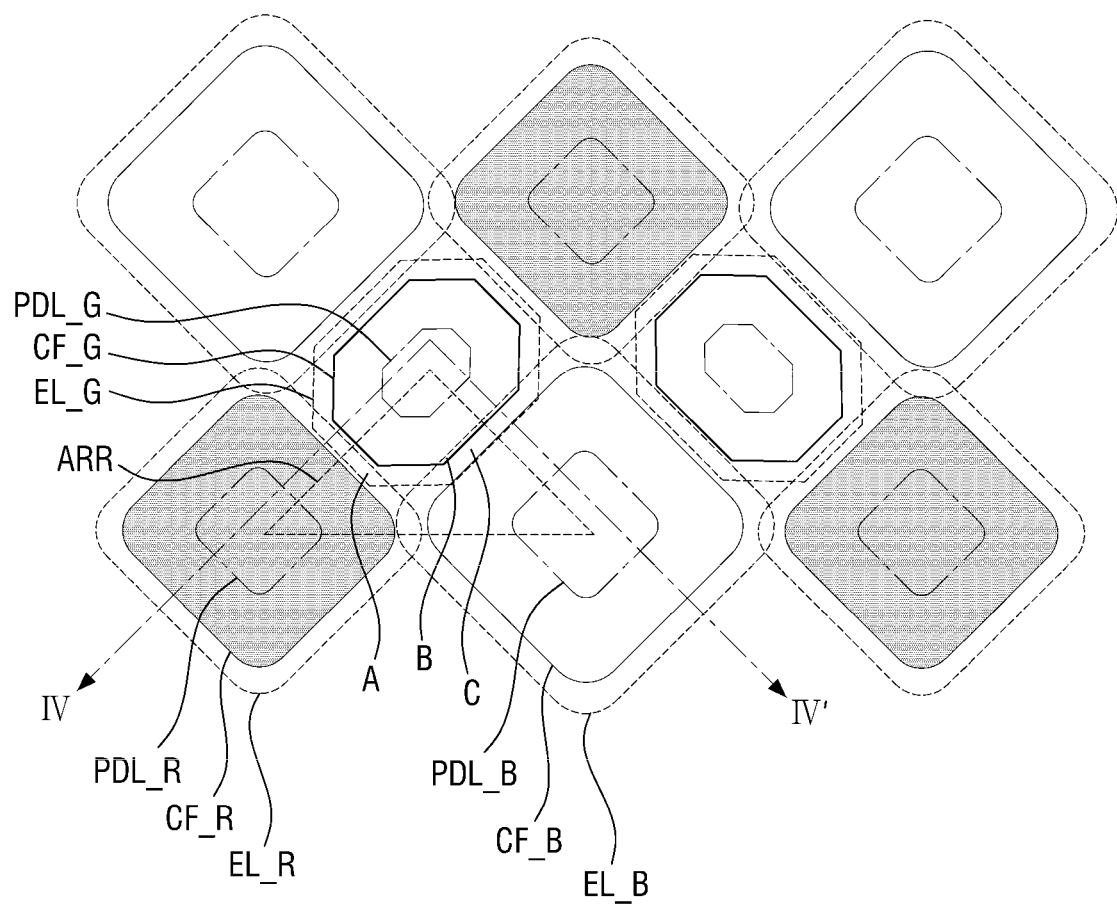
FIG. 22 is a plan view of a color filter included in a display device according to another exemplary embodiment.
Figure 23:
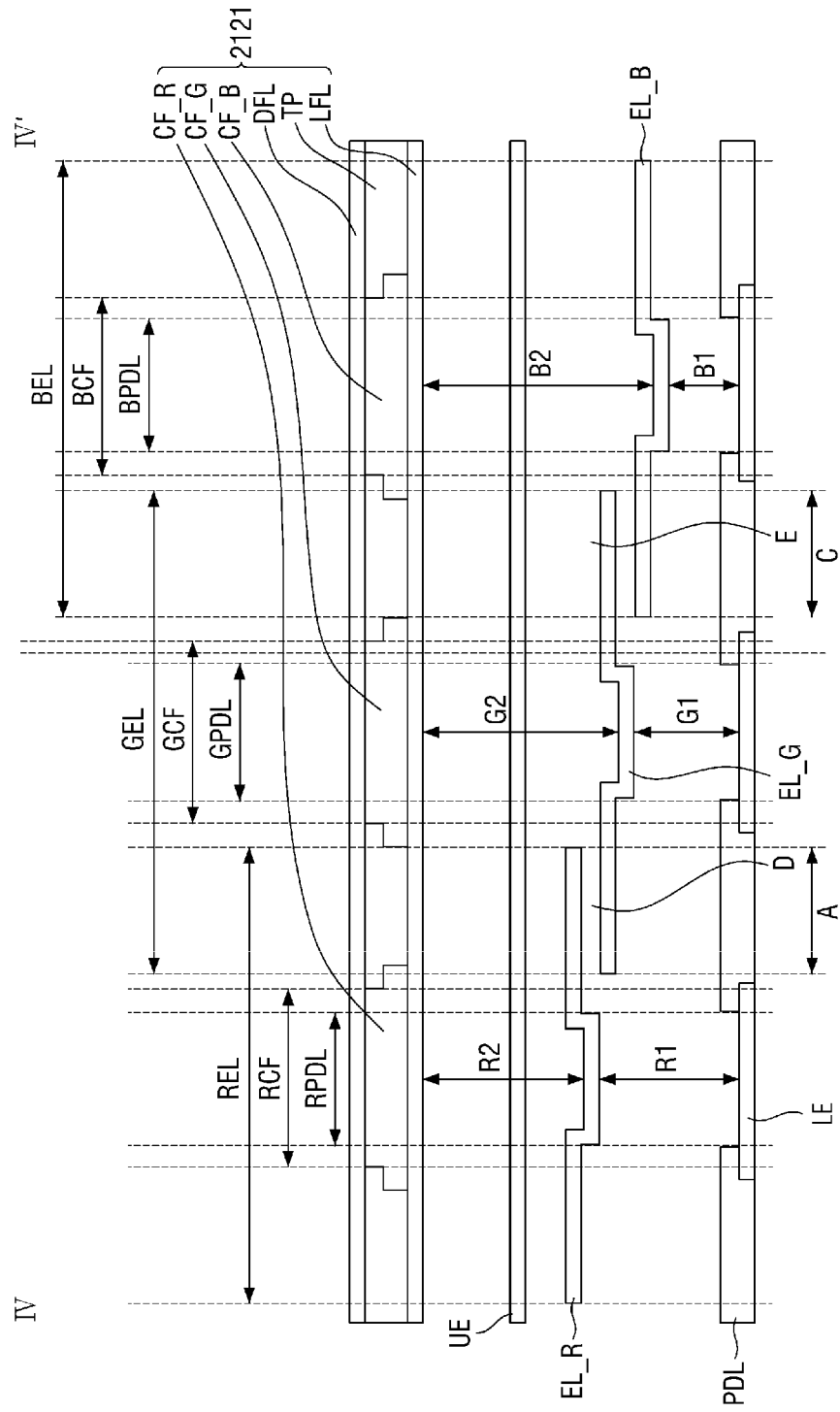
FIG. 23 is a cross-sectional view taken along line IV-IV' of FIG. 22.

FIG. 21 is a cross-sectional view of a display device according to another exemplary embodiment. FIG. 22 is a plan view of a color filter included in a display device according to another exemplary embodiment. FIG. 23 is a cross-sectional view taken along line IV-IV' of FIG. 22.

Referring to FIGS. 21 to 23, a display device 100_17 is substantially different from the display device 100 of FIG. 2 in that the display device 100_17 includes an upper flexible module 210.

The upper flexible module 2120 may include a color filter 2121 (or a color filter layer) instead of the flexible function module 221 (for example, a polarizing film) shown in FIG. 2.

The color filter 2121 may be disposed between the display module 210 and the flexible window module 222, and may be attached or coupled with the display module 210 and the flexible window module 222 by first and second double-sided adhesive layer NAD1 and NAD2.

Similarly to the polarizing filter, the color filter 2121 can prevent reflection of external light to thereby improve the visibility of the display device 100_17. By removing a polarizing film that is frequently detached while the display device is folded or unfolded repeatedly, it is possible to implement a POL-less display device.

The color filter 2121 may include a flexible polymer material such as polyimide. Then, the foldability (or ease folding) and transparency of the color filter 2121 can be achieved.

On the other hand, the color filter 2121 may be included in the high neutral plane control portion HNPC to place the neutral plane NP partially formed in the foldable region FR of the display module 210 in the display module 210.

As shown in FIG. 22, the color filter 2121 may include a red color filter CF_R (or a first monochromatic color filter), a green color filter CF_G (or a second monochromatic color filter), and a blue color filter CF_B (or a third monochromatic color filter). The red color filter CF_R, the green color filter CF_G, and the blue color filter CF_B may be arranged in a lattice shape.

The red color filter CF_R and the blue color filter CF_B may be arranged alternately adjacent to each other in the left-and-right direction. The red color filter CF_R and the blue color filter CF_B may be arranged alternately adjacent to each other in the up-and-down direction. The green color filter CF_G may be disposed between the red color filter CF_R and the blue color filter CF_B (or between the nearest red color filters CF_R and between the nearest blue color filters CF_B). The red color filter CF_R, the green color filter CF_G, and the blue color filter CF_B may be arranged at equal intervals and spaced apart from each other. Specifically, the red color filters CF_R, the green color filters CF_G, and the blue color filters CF_B may be repeatedly arranged in the diagonal direction (or a first direction). The red color filter CF_R, the green color filter CF_G, and blue color filter CF_B next to one another may be arranged in Δ shape (or Δ arrangement).

The red color filter CF_R may have a square shape. The corners of the square opposed to each other with respect to the center of area may be located on the same horizontal line or vertical line. Similarly, the blue color filter CF_B may have a square shape and may be disposed between the red color filters CF_R in the up-and-down direction and the left-and-right direction. Each of the corners of the blue color filter CF_B may be adjacent to the respective corners of different red color filters. The length of the sides of the blue color filter CF_B may be relatively greater than the length of the sides of the red color filter CF_R.

The green color filter CF_G may have a rectangular shape or an octagonal shape. The space formed by the red color filter CF_R and the blue color filter CF_B may have a rectangular shape, and the green color filter CF_G may have a shape conforming to this space.

As the red, green, and blue color filters CF_R, CF_G and CF_B are arranged in a lattice (or Δ arrangement), one direction of the lattice of the color filters may be substantially different from the direction in which the folding axis AXIS_F of the display device 100_17 is extended. For example, the first direction in which monochromatic color filters are arranged may form an acute angle with the folding axis AXIS_F. As such, defects that would otherwise occur when the direction of the lattice coincides with the folding axis can be reduced.

The display module 210 may include red, green, and blue pixels EL_R, EL_G, and EL_B (or red, green and blue light-emitting elements, first to third light-emitting elements, first to third electroluminescent emissive layers). The red, green, and blue pixels EL_R, EL_G, and EL_B may be arranged in a lattice (or Δshape) corresponding to the red color filter CF_R, the green color filter CF_G, and the blue color filter CF_B, respectively.

Therefore, it is possible to suppress defects that may otherwise occur when one direction of the lattice of the red, green, and blue pixels EL_R, EL_G, and EL_B coincides with the folding axis. The circuit wiring for the red, green, and blue pixels EL_R, EL_G, and EL_B may have an arrangement that coincides with the folding axis.

The red pixel EL_R may have a square shape, similarly to the red color filter CF_R. The red pixel EL_R may have the same center of area as the red color filter CF_R and may have an area relatively larger than that of the red color filter CF_R. Similarly, the blue pixel EL_B may have the same shape as the blue color filter CF_B, may have the same center of area as the blue color filter CF_B, and may have an area relatively larger than that of the blue color filter CF_B. The green pixel EL_G may have the same shape as the green color filter CF_G, may have the same center of area as the green color filter CF_G, and may have an area relatively larger than that of the green color filter CF_G.

Even if the pixels EL_R, EL_G, and EL_B overlap with one another, only the corresponding colors are transmitted by the color filters, so that each of the pixels EL_R, EL_G, and EL_B may be formed by overlapping with one another and may have a relatively large area. Accordingly, openings for depositing pixels in order to form each of the pixels EL_R, EL_G, and EL_B (i.e., openings PDL_R, PDL_G, and PDL_B of the pixel defining layer) may become larger, and the pixel deposition rate can be improved.

More particularly, the openings PDL_R, PDL_G, and PDL_B of the pixel defining layer are relatively smaller than the openings of the color filters CF_R, CF_G, and CF_B, and the periphery of the pixels (e.g., the pixels EL_R, EL_G, and EL_B) may be relatively larger than the openings of the color filters. Accordingly, the processing margin for pixel deposition can be increased until the different pixels EL_R, EL_G, and EL_B overlap with one another.

Accordingly, the red pixel EL_R may overlap with the green pixel EL_G in a first overlapping area A, and the green pixel EL_G may overlap with the blue pixel EL_B in a second overlapping area B. In addition, in a third overlapping area C, the green pixel EL_G, the blue pixel EL_B, and the green color filter CF_G may overlap with one another. In the overlapping areas A and B, a material capable of transferring (or carrying) charges provided from the lower electrode between overlapping pixels may be interposed.

Referring to FIG. 23, as described above with reference to FIG. 3, the lower electrodes LE may be disposed on the fifth inorganic layer 325 (or the planarization layer), and the pixel defining layers PDL may be formed to partially overlap with the lower electrodes LE. The portions of the lower electrodes LE exposed by the pixel defining layers PDL may be the openings RPDL, GPDL, and BPDL of the pixel defining layer. The blue pixel EL_R, the green pixel EL_G, and the red pixel EL_B may be formed in the respective openings of the pixel defining layer PDL. For the resonance effect, the pixels may have substantially different heights (R1, G1, and B1) (or substantially different thicknesses) from the lower electrodes LE in proportion to the length of the wavelength of each color, where R1>G1>B1. The upper electrode UE may be disposed on the pixels. The color filters 2121 may be disposed on the upper electrode UE.

The color filters 2121 may include red, green, and blue color filters CF_R, CR_G, and CF_B using a transparent film TP as a substrate. The thickness of the center of each of the color filters CF_R, CR_G, and CF_B may be relatively greater than the thickness at the edge, in consideration of the manufacturing method (for example, pigment dispersion method) of the color filter 2121, side visibility, etc. An upper planarization layer and a lower planarization layer are disposed on the upper and lower surfaces of the color filters CF_R, CR_G and CF_B, respectively, to flatten the color filters CF_R, CR_G and CF_B having substantially different levels. The upper planarization layer or the lower planarization layer may be made of a biphenyl-based epoxy material.

The distances R2, G2, and B2 from the pixels to the color filters may be substantially different from one another, in consideration of the resonance effect, where R2<G2<B2.

More specifically, the display device 100_17 may include: a lower electrode layer including a first lower electrode (e.g., the lower electrode LE corresponding to the green pixel EL_G) having first and second areas (i.e., the area overlapping with the pixel defining layer PDL and the area not overlapping with it), and a second lower electrode (e.g., the lower electrode LE corresponding to the blue pixel EL_B) having third and fourth areas; the pixel defining layer PDL disposed on the lower electrode layer and not covering the first and third areas while covering the second and fourth areas; a first electroluminescent layer (e.g., the light-emitting element of the green pixel EL_R) disposed on the pixel defining layer PDL and the first area of the first lower electrode, having an outline substantially (e.g., completely) surrounding the outline of the first area when viewed from the top, and having an area relatively larger than the first area; a second electroluminescent layer (e.g., the light-emitting element of the blue pixel EL_B) disposed on the pixel defining layer PDL and the third area, having an outline substantially (e.g., completely) surrounding the outline of the third area when viewed from the top, and having an area relatively larger than the third area; an upper electrode UE disposed on the first and second electroluminescent layers, having an outline substantially (e.g., completely) surrounding the outlines of the first and second electroluminescent layers when viewed from the top, and having an area relatively larger than the first and second electroluminescent layers; and a color filter layer (e.g., the color filter 2121) having a first color filter (e.g., the green color filter CF_G) disposed on the upper electrode UE and having a first color filtering area having an outline located between the outline of the first area and the outline of the first electroluminescent is layer when viewed from the top, and a second color filter (e.g., the blue color filter CF_B) disposed on the upper electrode UE and having a second color filtering area having an outline located between the outline of the third area and the outline of the second electroluminescent layer when viewed from the top. The first and second electroluminescent layers may overlap with each other. The first electroluminescent layer emits light of a first wavelength (e.g., green light), and the second electroluminescent layer emits light of a second wavelength (e.g., blue light) relatively shorter than the first wavelength. The first electroluminescent layer may be disposed on the second electroluminescent film. Further, the second electroluminescent layer may overlap with a first coloring area (e.g., the light-emitting element of the blue pixel EL_B may overlap with the red color filter in the second overlapping area B).

As described above, the display device 100_17 includes the color filter 2121 instead of the polarizing film, thereby preventing reflection of external light and improving visibility. In addition, since the color filters and the respective pixels (i.e., the pixels included in the display module 210) are arranged in a lattice (or Δ shape), and one direction of the lattice is parallel or does not coincide with the folding axis, it is possible to minimize defects that may otherwise would occur when the lattice direction coincides with the folding axis. Further, even if the pixels of different colors overlap with one another, only the light of the corresponding color is transmitted through each of the color filters. As such, different pixels can overlap with one another, thereby improving the processing margin of the pixel deposition and the deposition rate.

Figure 24:
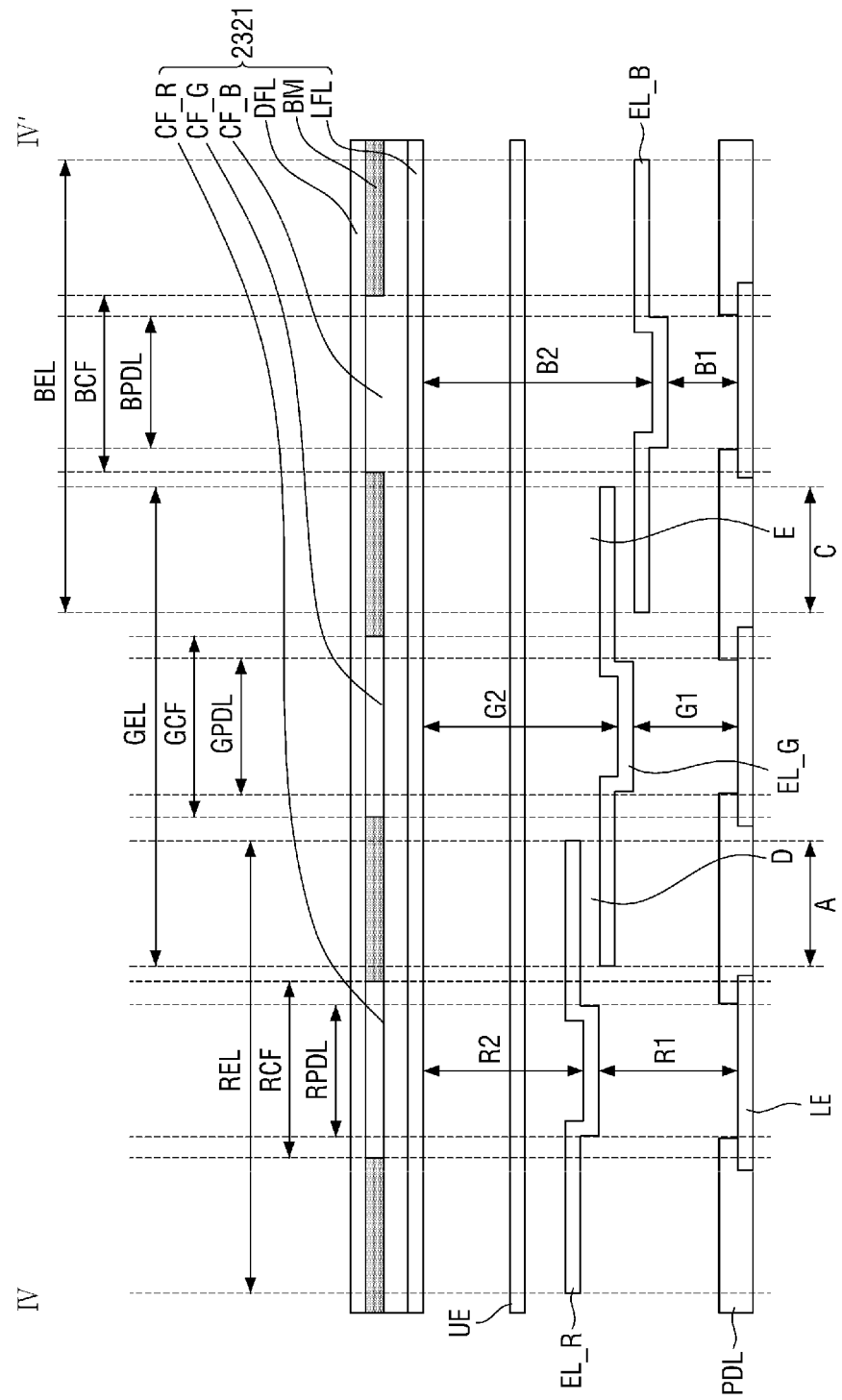
FIGS. 24 and 25 are cross-sectional views of display devices according to exemplary embodiments.
Figure 25:
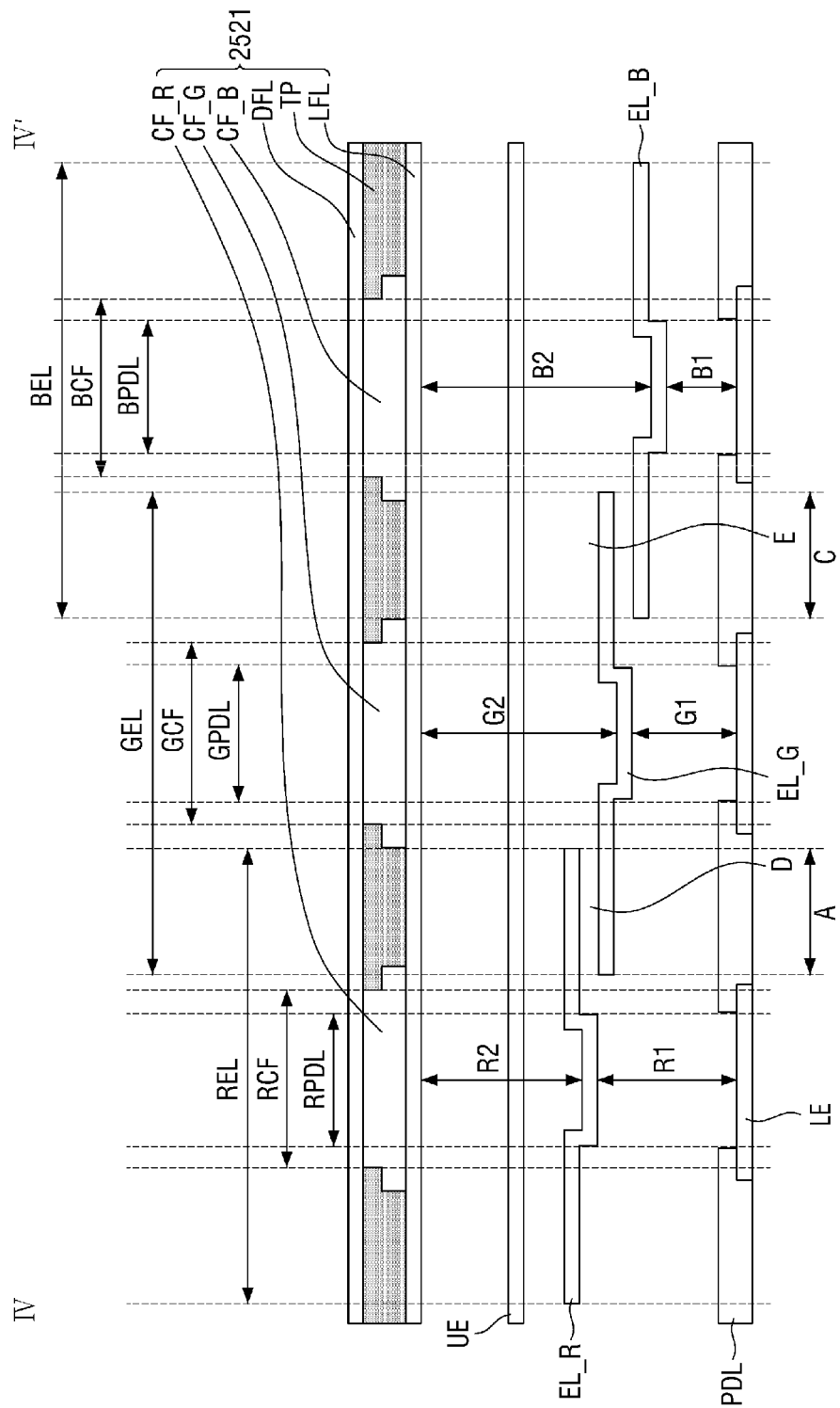

FIGS. 24 and 25 are cross-sectional views of display devices according to exemplary embodiments.

Referring to FIG. 24, a color filter 2321 is substantially different from the color filter 2121 of FIG. 23 in that the color filter 2321 further includes red, green, and blue color is filters CF_R, CF_G, and CF_B overlapping with one another and a black matrix BM.

In the areas where the pixels overlap with one another, the red, green, and blue color filters CF_R, CF_G, and CF_B may overlap with other color filters. For example, the red color filter CF_R may overlap with the green color filter CF_G in the first overlapping area A1, and the green color filter CF_G may overlap with the blue color filter CF_B in the second overlapping area A2.

The black matrix BM may be disposed in the area where the red, green, and blue color filters overlap with one another (e.g., the first area A1 and the second area A2). The black matrix BM may be used to separate red, green, and blue light from one another and may block light therebetween.

Referring to FIG. 25, a color filter 2521 is substantially different from the color filter 2121 of FIG. 23 in that the color filter 2521 further includes a black matrix BM.

The black matrix BM may be disposed between the red, green, and blue color filters CF_R, CF_G, and CF_B described above with reference to FIG. 22. The black matrix BM may be thicker at the center than at the edge.

It is to be noted that the openings RCF, GCF, and BCF of the color filters CF_R, CF_G, and CF_B may be formed or defined by the black matrix BM, substantially differently from the openings of the color filters shown in FIG. 23. As a result, there may be no second overlapping area B.

As described above, the color filter 2121 may include a black matrix BM, such that the overlapping area (e.g., the second overlapping area B) can be removed.

Figure 26:
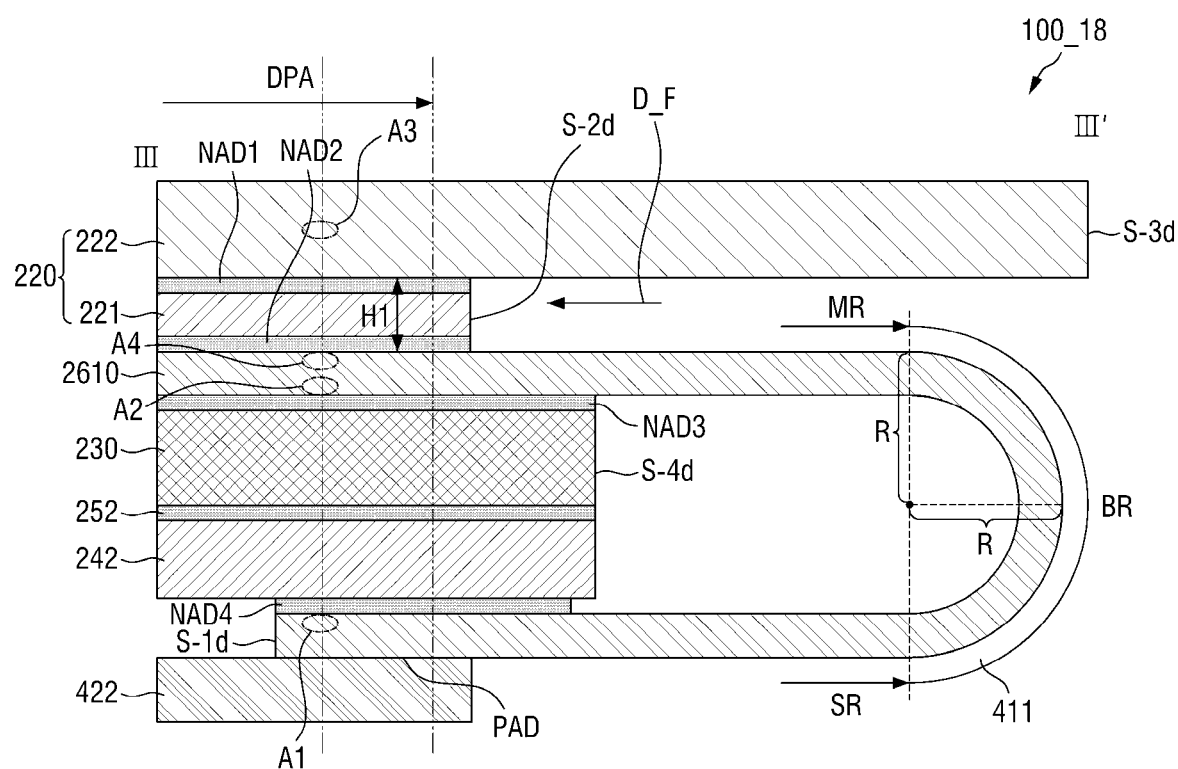
FIG. 26 is a cross-sectional view of a display device according to yet another exemplary embodiment.
Figure 27:
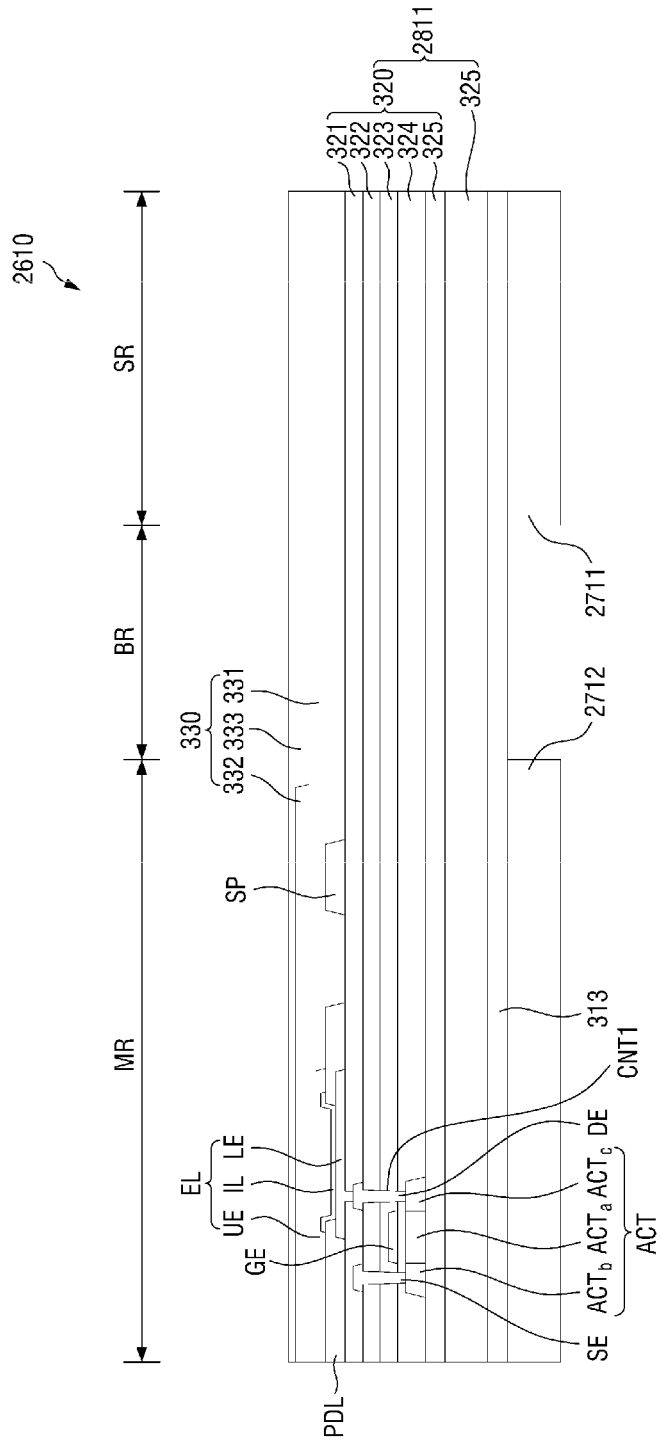
FIG. 27 is a cross-sectional view of a display module included in the display device according to an exemplary embodiment.

FIG. 26 is a cross-sectional view of a display device according to yet another exemplary embodiment. FIG. 27 is a cross-sectional view of a display module included in the display device according to an exemplary embodiment.

Referring to FIGS. 26 and 27, a display device 100_18 is substantially different from the display device 100 of FIG. 4 in that the display device 100_18 includes a display module 2610.

The display module 2610 may include substantially different materials in a first area A1 and a second area A2.

As shown in FIGS. 26 and 27, the first area A1 of the display module 2610 may include a first polymer layer 2711 of a first repeated subunit organic compound (e.g., monomer), while the second area A2 of the display module 2610 may include a second polymer layer 2712 of a second repeated subunit organic compound (e.g., monomer). The first polymer layer 2711 may be disposed on the lower surface of the display module 2610 in the sub region SR, while the second polymer layer 2712 may be disposed on the lower surface of the display module 2610 in the main region MR (e.g., when the display module 2610 is not bent).

The first polymer layer 2711 may include polyethylene terephthalate (PET) or an acrylic resin. For example, when the first polymer layer is made of polyethylene terephthalate (PET), the first repeated subunit organic compound may be bis(2-hydroxyethyl) terephthalate.

The second polymer layer 2712 may be a colored polyimide (PI).

When the second polymer layer 2712 is extended to the first polymer layer 2711 in the display module 2610 (e.g., when the second polymer layer 2712 is disposed in the first area A1), a carbon material may be generated from the colored PI during a laser processing to shape the pad unit (e.g., the panel pad unit for coupling with the circuit board 422), which may be accumulated on the near side walls. In addition, foreign matter may be generated when the pads included in the pad unit are thermally compressed. Furthermore, since the colored PI has a low visible light transmittance than PET, it may act as an inhibiting factor during the process of thermo-compression. In addition, when the second polymer layer 2712 is extended to the first polymer layer 2711 in the display module 2610 (e.g., when the second polymer layer 2712 is disposed in the first area A1), since the reliability of PET under high-temperature and high-humidity is relatively less than that of the colored PI, it may be difficult to obtain reliability of the organic light-emitting diode (OLED) formed on the display module under high temperature and high humidity. Therefore, the first and second polymer layers 2711 and 2712 may be separated from each other, and PET may be used as the first polymer layer 2711 and the colored PI may be used as the second polymer layer 2712.

The flexible window module 222 may include a third polymer layer of a third repeated subunit organic compound (e.g., monomer). The third polymer layer may contain a transparent PI. When the second polymer layer 2712 is a colored PI, the second repeated subunit organic compound and the third repeated subunit organic compound may include the same imide series.

Although the third polymer layer may include PI due to its strength, the PI generally may have a yellowish color. As such, the PI having a color may not be appropriate for the window. Thus, by reducing the aromatic ring density of PI, the third polymer layer may be made of transparent PI. However, the thermal and mechanical properties, such as the ultimate tensile strength, initial tensile modulus, elongation at break, and glass transition temperature may be somewhat reduced.

When the first polymer layer 2711 is made of PET or an acrylic resin, the second polymer layer 2712 may include the colored PI and the third polymer layer may include the transparent PI. In this manner, the first polymer layer 2711, the second polymer layer 2712, and the third polymer layer may have the following relationship in thermal and mechanical properties.

The second polymer layer 2712 may have an ultimate tensile strength (MPa) relatively greater than that of the first polymer layer 2711. The third polymer layer may have an ultimate tensile strength relatively greater than that of the first polymer layer 2711. The second polymer layer 2712 may have the ultimate tensile strength relatively greater than that of the third polymer layer.

The second polymer layer 2712 may have an initial tensile modulus (GPa) relatively greater than that of the first polymer layer 2711. The third polymer layer may have an initial tensile modulus relatively greater than that of the first polymer layer 2711. The second polymer layer 2712 may have an initial tensile modulus relatively greater than that of the third polymer layer.

The second polymer layer 2712 may have an elongation percent at break (%) relatively greater than that of the first polymer layer 2711. The third polymer layer may have an elongation percentage at break relatively greater than that of the first polymer layer 2711. The second polymer layer 2712 may have an elongation percentage at break relatively greater than that of the third polymer layer.

The second polymer layer 2712 may have an $O_2$ transmission rate (cc/m$^2$/day) relatively less than that of the first polymer layer 2711. The third polymer layer may have an $O_2$ transmission rate relatively less than that of the first polymer layer 2711. The second polymer layer 2712 may have an $O_2$ transmission rate relatively less than that of the third polymer layer.

The second polymer layer 2712 may have a glass transition temperature (Tg, ° C.) relatively greater than that of the first polymer layer 2711. The third polymer layer may have a glass transition temperature relatively greater than that of the first polymer layer 2711. The second polymer layer 2712 may have a glass transition temperature relatively greater than that of the third polymer layer.

The second polymer layer 2712 may have a visible light transmittance relatively greater than that of the first polymer layer 2711 (e.g., light in the range of 380 to 780 nm). The third polymer layer may have a visible light transmittance relatively greater than that of the second polymer layer 2712.

The second polymer layer 2712 may have a yellow index (YI) relatively greater than that of the first polymer layer 2711. The second polymer layer 2712 may have a yellow index (YI) relatively greater than that of the third polymer layer.

The second polymer layer 2712 may have an aromatic ring density relatively greater than that of the first polymer layer 2711. The third polymer layer may have an aromatic ring density relatively greater than that of the first polymer layer 2711. The second polymer layer 2712 may have an aromatic ring density relatively greater than that of the third polymer layer.

As described above, the display module 2610 includes the colored PI disposed adjacent to the main region MR, and the PET disposed adjacent to the sub region SR, so that the quality of the device can be improved.

Figure 28:
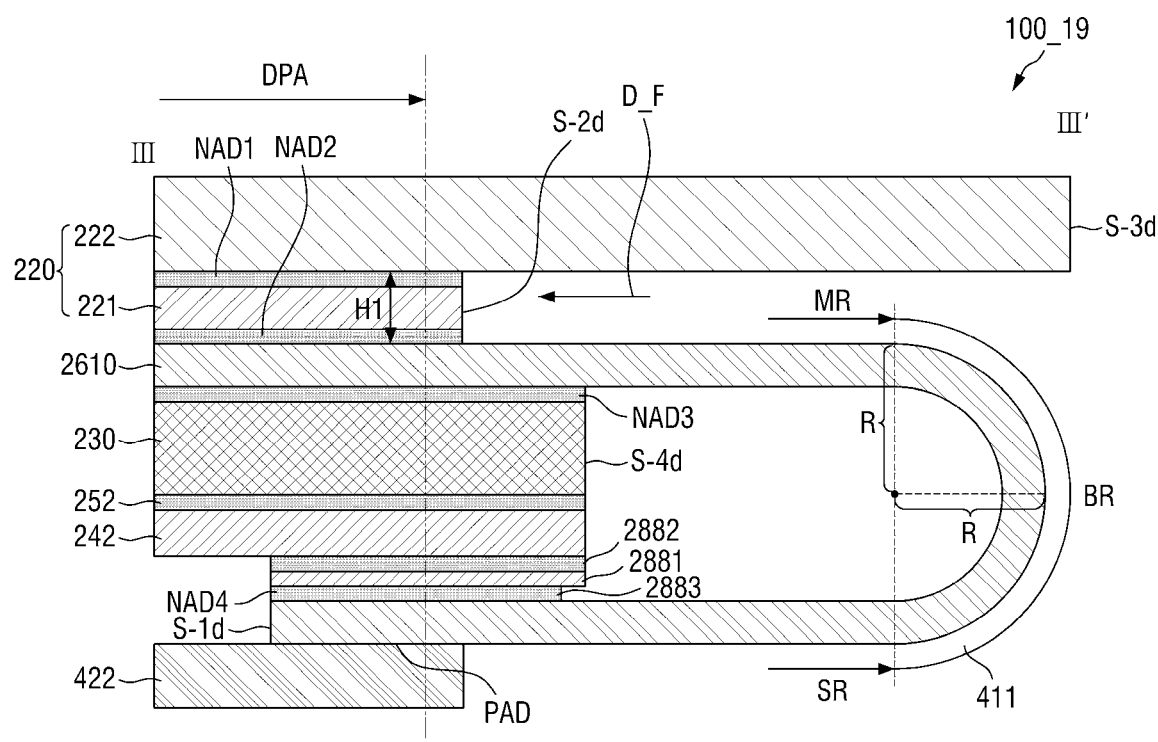
FIG. 28 is a cross-sectional view of a display device according to another is exemplary embodiment.

FIG. 28 is a cross-sectional view of a display device according to yet another exemplary embodiment.

Referring to FIG. 28, a display device 100_19 is substantially different from the display device 100_18 of FIG. 26 in that the display device 100_19 further includes a spacer layer 2881.

The spacer layer 2881 may be disposed between the second plate 242 (or the rigid layer 240) and the sub region SR of the display module 2610. The spacer layer 2881 may prevent breakage of the bent region BR due to erroneous setting of the bending radius of curvature R of the display module 2610 (e.g., if the bending radius of curvature R is set to be too small).

The spacer layer 2881 may be attached to the display module 2610 and the rigid layer 240 by double-sided adhesive layers 2882 and 2883, respectively.

Figure 29:
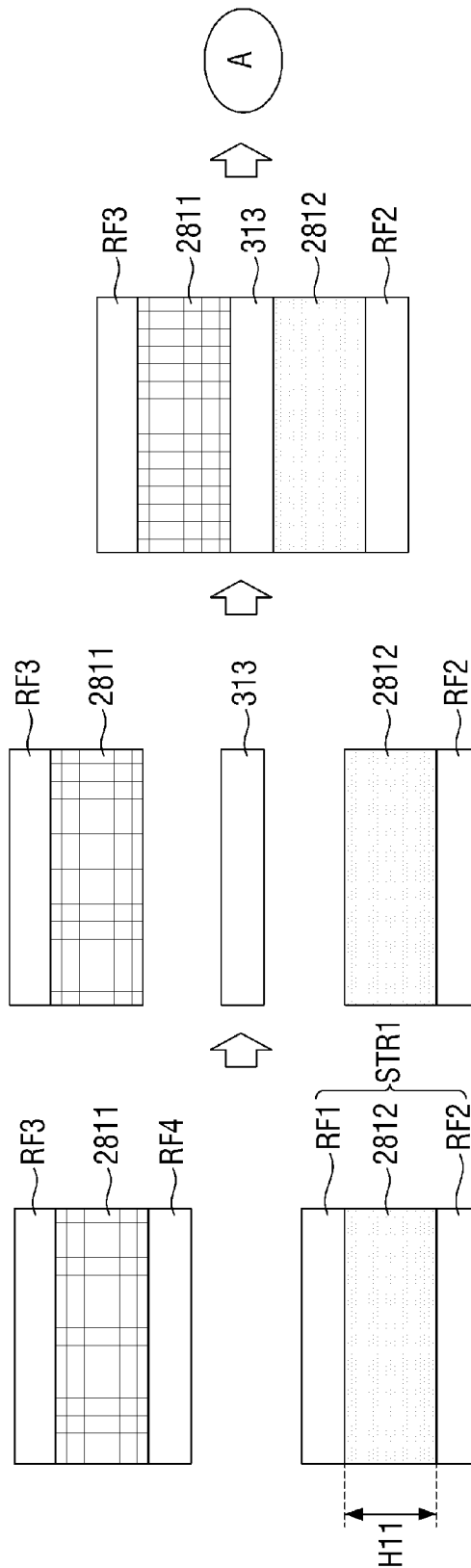
FIGS. 29 and 30 are views for illustrating a process of fabricating a display device according to another exemplary embodiment.
Figure 30:
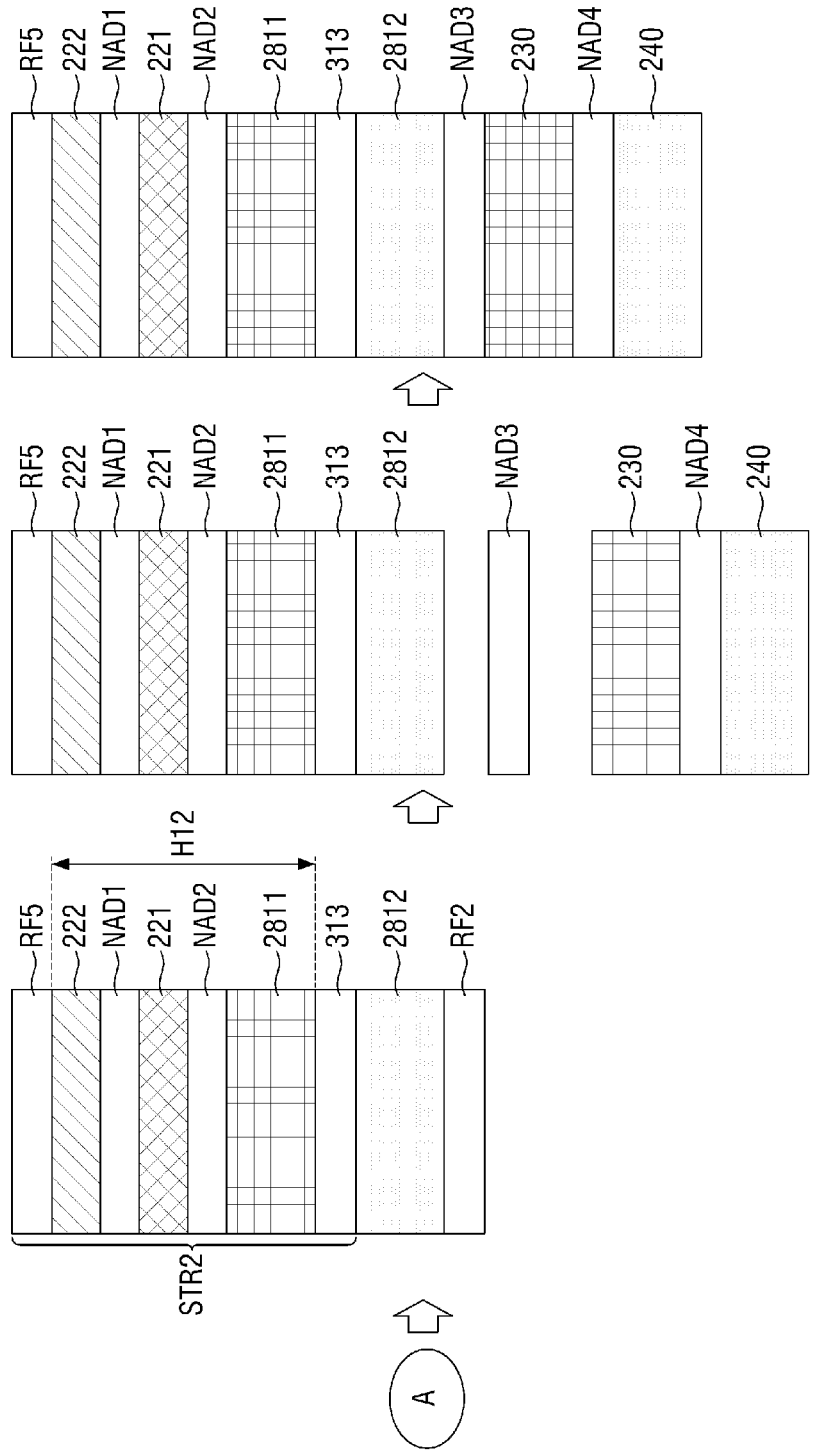

FIGS. 29 and 30 are views for illustrating a process of fabricating a display device according to another exemplary embodiment.

Referring to FIGS. 29 and 30, a first structure STR1 may be prepared. The first structure STR1 may include a lower flexible film 2812 (or a first flexible member), a first release film RF1, and a lower release film RF2. The lower flexible film 2812 may be the second organic flexible layer 312 described above with reference to FIG. 5. The lower flexible film 2812 may have a first height H11. The first release film RF1 may have a first release force and may be attached on the lower flexible film 2812. The lower release film RF2 may have a second release force and may be attached under the lower flexible film 2812. The second release force may be relatively greater than the first release force. For example, the second release force may be "n" times the first release force, where "n" is a real number relatively greater than about one. For example, the first release force may be approximately 6 to 9 gf/in, and the second release force may be approximately 26 to 38 gf/in. More particularly, when the second release force is relatively greater than the first release force, the second release film RF2 may not be detached when the first release film RF is detached.

A preliminary panel 2811 may be prepared. The preliminary panel 2811 may include elements of the display module 210 described above with reference to FIG. 3, except for the second organic flexible layer 312 and the double-sided adhesive layer 313. The third release film RF3 may be attached on the upper surface of the preliminary panel 2811, and the fourth release film RF4 may be attached under the lower surface of the preliminary panel 2811.

Subsequently, the first release film RF may be detached from the upper surface of the lower flexible film 2812. The second release film RF2 may not be detached from the lower surface of the lower flexible film 2812.

At the same time, the fourth release film RF4 may be detached from the lower surface of the preliminary panel 2811. The third release film RF3 may not be detached from the upper surface of the preliminary panel 2811.

The preliminary panel 2811 may be attached on the lower flexible film 2812 by the double-sided adhesive layer 313.

Subsequently, the third release film RF3 may be detached or removed from the upper surface of the preliminary panel 2811, and the functional layer 221 and the window layer 222 may be formed on the upper surface of the preliminary panel 2811. For example, the functional layer 221 may be attached to the upper surface of the preliminary panel 2811 by the second double-sided adhesive layer NAD2, and the window layer 222 may be attached to the upper surface of the functional layer 221 by the first double-sided adhesive layer. A fifth release film RF5 may be attached to the upper surface of the window layer 222.

In particular, the preliminary panel 2811, the second double-sided adhesive layer NAD2, the functional layer 221, the first double-sided adhesive layer NAD1, and the window film 222 may be sequentially stacked on the lower flexible film 2812, such that the second structure STR2 may be formed. The fifth release film RF5 may have a third release force. The third release force may be relatively less than the second release force (i.e., the release force of the second release film RF2). For example, the second release force may be "m" times the third release force, where "m" is a real number relatively greater than 3. For example, although the release force of the fifth release film RF5 cannot be sufficiently increased because the upper surface of the window layer 222 is subjected to anti-fingerprint process, the release force of the fifth release film RF5 may be in the range of 10 to 26 gf/in to prevent the second upper release film from being detached while the second release film RF2 is detached.

The adhesive force of the double-sided adhesive layer 313 to the lower flexible film 2812 and the adhesive force of the double-sided adhesive layer 313 to the second structure STR2 may be relatively greater than the second release force and the third release force.

Subsequently, the second release film RF2 may be detached or removed from the lower surface of the lower flexible film 2812. The fifth release film RF5 may not be detached from the upper surface of the lower flexible film 2812 (or the second structure STR2).

A lower flexible module 230 and a plate 240 may be attached under the lower flexible film 2812. The lower flexible module 230 and the plate 240 are already coupled with each other by the fourth double-sided adhesive layer NAD4, and may be attached under the lower flexible film 2812 by the third double-sided adhesive layer NAD3.

The adhesive force of the third double-sided adhesive layer NAD3 may be relatively larger than the first to third release forces. Therefore, the third double-sided adhesive layer NAD3 may not be detached when the release films (e.g., the second release film RF2 and the third release film RF3) are removed. Similarly, the adhesive strength of the first and second double-sided adhesive layers NAD1 and NAD2 may be relatively greater than the first to third release forces.

In an exemplary embodiment, the first release force of the first release film RF1 may be approximately 6.5 to 7.5 gf/in, the second release force of the second release film RF2 may be 32.5 to 33.5 gf/in, and the third release force of the fifth release film RF5 may be 19.5 to 20.5 gf/in. According to an exemplary embodiment, "n" may be relatively greater than "m". More specifically, "n" may range from 4 to 5, and "m" may range from 1.5 to 2.

According to an exemplary embodiment, a foldable display device includes a first polymer layer including a first repeated subunit organic compound and a second polymer layer including a second repeated subunit organic compound, to improve thermal and mechanical properties and the quality of the device.

According to another exemplary embodiment, a method of manufacturing a foldable display device can prevent the deterioration of the quality of the display device by manufacturing the display device in consideration of the release force of a release film having a flexible film attached thereto.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device comprising:
   a panel pad unit;
   a first polymer layer disposed on the panel pad unit and comprising a first repeated subunit organic compound;
   a rigid layer disposed on the first polymer layer;
   a second polymer layer disposed on the rigid layer and comprising a second repeated subunit organic compound;
   a panel light-emitting unit disposed on the second polymer layer; and
   a third polymer layer disposed on the panel light-emitting unit and comprising a third repeated subunit organic compound,
   wherein:
   the panel light-emitting unit has a first non-foldable region, a second non-foldable region, and a foldable region between the first and second non-foldable regions;
   the rigid layer comprises a first portion corresponding to the first non-foldable region and a second portion corresponding to the second non-foldable region; and
   the panel pad unit is integrally formed with the panel light-emitting unit as a single piece such that the panel pad unit is connected to the panel light-emitting unit.

2. The foldable display device of claim 1, wherein the rigid layer comprises metal.

3. The foldable display device of claim 1, wherein a neutral plane is configured to be formed in the panel light-emitting unit between the first portion and the second portion.

4. The foldable display device of claim 1, further comprising a spacer layer disposed between the first polymer layer and the rigid layer.

5. The foldable display device of claim 1, wherein the second polymer layer has a visible light transmittance relatively less than that of the third polymer layer.

6. The foldable display device of claim 1, wherein the second polymer layer has a visible light transmittance relatively less than that of the first polymer layer.

7. The foldable display device of claim 1, wherein:
   the second polymer layer has a thermo-mechanical property relatively greater than that of the third polymer layer; and
   the thermo-mechanical property is at least one selected from the group consisting of ultimate tensile strength, initial tensile modulus, elongation at break, and glass transition temperature.

8. The foldable display device of claim 1, wherein:
   the first repeated subunit organic compound is included in a first series; and
   the second repeated subunit organic compound and the third repeated subunit organic compound are included in a second series substantially different from the first series.

9. The foldable display device of claim 8, wherein:
   the second series is an aromatic series; and
   the second repeated subunit organic compound has an aromatic ring density relatively greater than that of the third repeated subunit organic compound.

10. The foldable display device of claim 8, wherein:
    the first series is a non-aromatic series; and
    the second series is an aromatic series.

11. The foldable display device of claim 1, wherein the second polymer layer has a yellow index relatively greater than that of the first polymer layer.

12. The foldable display device of claim 11, wherein the second polymer layer has a yellow index relatively greater than that of the third polymer layer.

13. The foldable display device of claim 1, wherein the second polymer layer has a yellow index relatively greater than that of the third polymer layer.

* * * * *